United States Patent
Xu et al.

(10) Patent No.: US 11,062,645 B1
(45) Date of Patent: Jul. 13, 2021

(54) DISPLAY DEVICE

(71) Applicants: Beijing BOE Technology Development Co., Ltd., Beijing (CN); BOE Technology Group Co., Ltd., Beijing (CN)

(72) Inventors: Chen Xu, Beijing (CN); Xueguang Hao, Beijing (CN); Yong Qiao, Beijing (CN); Xinyin Wu, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/909,204

(22) Filed: Jun. 23, 2020

(30) Foreign Application Priority Data

Dec. 24, 2019 (CN) .......................... 201922347981.8

(51) Int. Cl.
*G09G 3/32* (2016.01)

(52) U.S. Cl.
CPC ....... *G09G 3/32* (2013.01); *G09G 2300/0819* (2013.01); *G09G 2310/0286* (2013.01); *G09G 2310/06* (2013.01)

(58) Field of Classification Search
CPC ...... G09G 3/32; G09G 3/3677; G09G 3/3266; G09G 3/20; G09G 3/3233; G09G 3/3255; G09G 3/2014; G09G 2300/0819; G09G 2300/0861; G09G 2300/0852; G09G 2310/0286; G09G 2310/0267; G09G 2310/06; G09G 2310/08; G09G 2320/0626; G09G 2320/064; G09G 2320/0233; G09G 2330/021; G11C 19/28; G11C 19/287; H03K 3/017

See application file for complete search history.

(56) References Cited

U.S. PATENT DOCUMENTS

| | | | | |
|---|---|---|---|---|
| 2017/0186360 | A1* | 6/2017 | Ma | H01L 27/3244 |
| 2019/0340975 | A1* | 11/2019 | Zhai | G09G 3/3225 |
| 2019/0347997 | A1* | 11/2019 | Park | G11C 19/28 |
| 2020/0066209 | A1* | 2/2020 | Zhang | G09G 3/3677 |

* cited by examiner

*Primary Examiner* — Christopher E Leiby
(74) *Attorney, Agent, or Firm* — Arent Fox LLP; Michael Fainberg

(57) ABSTRACT

Disclosed is a display device, including a plurality of pixel circuits located in a display area, and a light-emitting driving circuit located in a non-display area and electrically connected to the plurality of pixel circuits; the light-emitting driving circuit includes a plurality of cascaded shift registers; except a last stage of shift register, a signal output terminal of each stage of remaining shift registers is electrically connected to an input signal terminal of a next stage of shift register adjacent thereto; each of the plurality of cascaded shift registers includes: an input circuit, a first node potential control circuit, a second node potential control circuit, a first isolation circuit, a second isolation circuit, a first output control circuit, a second output control circuit, a capacitor circuit, a first output circuit and a second output circuit.

20 Claims, 13 Drawing Sheets

DISPLAY DEVICE

CROSS REFERENCE TO RELATED APPLICATION

The present application claims priority of a Chinese patent application No. 201922347981.8 filed on Dec. 24, 2019, the disclosure of which is incorporated by reference in its entirety.

FIELD

The present disclosure relates to the technical field of display, and particularly to a display device.

BACKGROUND

Display technology is widely applied to TV sets, mobile phones and public information display. The display devices, such as display panels, can display colorful pictures and have various types. In the related art, both Thin Film Transistor-Liquid Crystal Display (TFT-LCD) and Organic Light Emitting Diode (OLED) require control under a driving Integrated Circuit (IC). The driving IC controls the display panel to implement the functions of line-by-line scanning and frame-by-frame refreshing, so that image data input to the display panel can be refreshed in real time, thereby realizing dynamic display.

SUMMARY

An embodiment of the present disclosure provides a display device. The display device includes:
a plurality of pixel circuits located in a display area, where the plurality of pixel circuits comprises N rows of pixel circuit groups, and each row of pixel circuit group comprises M pixel circuits, and where N and M are positive integers; and
a light-emitting driving circuit located in a non-display area, wherein the light-emitting driving circuit comprises a plurality of cascaded shift registers; a signal output terminal of each stage of the plurality of cascaded shift registers except a last stage is electrically connected to an input signal terminal of a next stage of shift register adjacent thereto, and each stage of shift register is connected to at least one of the N rows of pixel circuit groups through a light-emitting control line;
where each of the plurality of cascaded shift registers comprises: an input circuit, a first node potential control circuit, a second node potential control circuit, a first isolation circuit, a second isolation circuit, a first output control circuit, a second output control circuit, a capacitor circuit, a first output circuit and a second output circuit;
the input circuit is configured to provide a signal of an input signal terminal to an input terminal of the second isolation circuit under control of signal of a first clock signal terminal;
the first node potential control circuit is configured to provide a first potential signal of a first potential signal terminal to an input terminal of the first isolation circuit under control of a signal of the first clock signal terminal, and provide a first clock signal of the first clock signal terminal to the input terminal of the first isolation circuit under control of a signal of the input terminal of the second isolation circuit;
the second node potential control circuit is configured to provide a second potential signal of a second potential signal terminal to the input terminal or an output terminal of the second isolation circuit under control of a signal of the input terminal or an output terminal of the first isolation circuit;
the first isolation circuit is configured to isolate an electrical potential of the input terminal of the first isolation circuit from an electrical potential of the output terminal of the first isolation circuit under control of the first potential signal;
the second isolation circuit is configured to isolate an electrical potential of the input terminal of the second isolation circuit from an electrical potential of a control terminal of the second output circuit under control of the first potential signal;
the first output control circuit is configured to provide the second clock signal to a control terminal of the first output circuit under control of the signal of the output terminal of the first isolation circuit and the second clock signal;
the second output control circuit is configured to control an electrical potential of the control terminal of the second output circuit under control of the second clock signal;
the first output circuit is configured to provide the second potential signal to the signal output terminal under control of an electrical potential of the control terminal of the first output circuit; and
the second output circuit is configured to provide the first potential signal to the signal output terminal under control of the electrical potential of the control terminal of the second output circuit;
where the signal output terminal is electrically connected to the light-emitting control line.

In some embodiments, the display area further includes:
a plurality of gate lines extending in a row direction, and a plurality of data lines extending in a column direction;
for a pixel circuit at position (n, m), where 1≤n≤N, 1≤m≤M, the pixel circuit includes: a first light-emitting element, a driving transistor, a data writing transistor, a compensation transistor, a first light-emitting control transistor, a second light-emitting control transistor, a first reset transistor, a second reset transistor, and a storage capacitor;
a first electrode of the driving transistor is electrically connected to the power supply line through the first light-emitting control transistor; a second electrode of the driving transistor is electrically connected to an anode of the first light-emitting element through the second light-emitting control transistor;
a control electrode of the first light-emitting control transistor and a control electrode of the second light-emitting control transistor each is electrically connected to the corresponding light-emitting control line;
a control electrode of the data writing transistor is electrically connected to an nth row of gate line, and a first electrode of the data writing transistor is electrically connected to an mth column of data line, and a second electrode of the data writing transistor is electrically connected to the first electrode of the driving transistor;
a control electrode of the compensation transistor is electrically connected to the nth row of gate line, and a first electrode of the compensation transistor is electrically connected to a control electrode of the driving transistor, and a second electrode of the compensation transistor is electrically connected to the second electrode of the driving transistor;

a first terminal of the storage capacitor is electrically connected to the power supply line, and a second terminal of the storage capacitor is electrically connected to the control electrode of the driving transistor;

a control electrode of the first reset transistor is electrically connected to an nth row of reset line, a first electrode of the first reset transistor is electrically connected to the control electrode of the driving transistor, and a second electrode of the first reset transistor is electrically connected to an initial potential line;

a control electrode of the second reset transistor is electrically connected to a (n+1)th row of reset line, a first electrode of the second reset transistor is electrically connected to the anode of the first light-emitting element, and a second electrode of the second reset transistor is electrically connected to the initial potential line; a cathode of the first light-emitting element is electrically connected to a low-potential line.

In some embodiments, the non-display area further includes: a gate driving circuit connected to the plurality of gate lines extending in the row direction; and the light-emitting driving circuit is located at a side of the gate driving circuit far away from an edge of the display area.

In some embodiments, the input circuit includes: a first transistor. A gate of the first transistor is electrically connected to the first clock signal terminal, and a first electrode of the first transistor is electrically connected to the input signal terminal, and a second electrode of the first transistor is electrically connected to the input terminal of the first isolation circuit. The first node potential control circuit includes: a second transistor and a third transistor; a gate of the second transistor is electrically connected to an output terminal of the input circuit, a first electrode of the second transistor is electrically connected to the first clock signal terminal, and a second electrode of the second transistor is electrically connected to the input terminal of the first isolation circuit; a gate of the third transistor is electrically connected to the first clock signal terminal, a first electrode of the third transistor is electrically connected to the first potential signal terminal, and a second electrode of the third transistor is electrically connected to the input terminal of the first isolation circuit. The second output control circuit includes: a first capacitor; a first electrode of the first capacitor is electrically connected to the second clock signal terminal, and a second electrode of the first capacitor is electrically connected to the control terminal of the second output circuit.

In some embodiments, the second node potential control circuit includes: a fourth transistor and a fifth transistor. A gate of the fourth transistor is electrically connected to a second electrode of the fifth transistor, a first electrode of the fourth transistor is electrically connected to the second potential signal terminal, and a second electrode of the fourth transistor is electrically connected to the input terminal or the output terminal of the second isolation circuit. A gate of the fifth transistor is electrically connected to the input terminal or the output terminal of the first isolation circuit, and a first electrode of the fifth transistor is electrically connected to the second clock signal terminal.

In some embodiments, the second node potential control circuit includes: a fourth transistor and a fifth transistor. A gate of the fourth transistor is electrically connected to the second clock signal terminal, a first electrode of the fourth transistor is electrically connected to a second electrode of the fifth transistor, and a second electrode of the fourth transistor is electrically connected to the input terminal or the output terminal of the second isolation circuit; a gate of the fifth transistor is electrically connected to the input terminal or the output terminal of the first isolation circuit, and a first electrode of the fifth transistor is electrically connected to the second potential signal terminal.

In some embodiments, the first output control circuit includes: a sixth transistor, a seventh transistor and an eighth transistor. A gate of the sixth transistor is electrically connected to the output terminal of the first isolation circuit, a first electrode of the sixth transistor is electrically connected to the second clock signal terminal, and a second electrode of the sixth transistor is electrically connected to a first electrode of the seventh transistor. A gate of the seventh transistor is electrically connected to the second clock signal terminal, and a second electrode of the seventh transistor is electrically connected to the control terminal of the first output circuit. A gate of the eighth transistor is electrically connected to the control terminal of the second output circuit or the input terminal of the second isolation circuit, a first electrode of the eighth transistor is electrically connected to the second potential signal terminal, and a second electrode of the eighth transistor is electrically connected to the control terminal of the first output circuit.

In some embodiments, the capacitor circuit is configured to control the electrical potential of the output terminal of the first isolation circuit under control of the first output control circuit.

In some embodiments, the capacitor circuit includes: a second capacitor. A first electrode of the second capacitor is electrically connected to the output terminal of the first isolation circuit, and a second electrode of the second capacitor is electrically connected to the first electrode of the seventh transistor.

In some embodiments, the first output control circuit includes: a sixth transistor, a seventh transistor and an eighth transistor. A gate of the sixth transistor is electrically connected to the output terminal of the first isolation circuit, a first electrode of the sixth transistor is electrically connected to the first potential signal terminal, and a second electrode of the sixth transistor is electrically connected to a first electrode of the seventh transistor. A gate of the seventh transistor is electrically connected to the second clock signal terminal, and a second electrode of the seventh transistor is electrically connected to the control terminal of the first output circuit. A gate of the eighth transistor is electrically connected to the control terminal of the second output circuit or the input terminal of the second isolation circuit, a first electrode of the eighth transistor is electrically connected to the second potential signal terminal, and a second electrode of the eighth transistor is electrically connected to the control terminal of the first output circuit.

In some embodiments, the capacitor circuit is configured to control the electrical potential of the output terminal of the first isolation circuit under control of the signal of the second clock signal terminal.

In some embodiments, the capacitor circuit includes: a second capacitor. A first electrode of the second capacitor is electrically connected to the output terminal of the first isolation circuit, and a second electrode of the second capacitor is electrically connected to the second clock signal terminal.

In some embodiments, the first output circuit includes: a ninth transistor and a third capacitor. A gate of the ninth transistor is electrically connected to an output terminal of the first output control circuit, a first electrode of the ninth transistor is electrically connected to the second potential signal terminal, and a second electrode of the ninth transistor is electrically connected to the signal output terminal; a first electrode of the third capacitor is electrically connected to the gate of the ninth transistor, and a second electrode of the third capacitor is electrically connected to the second potential signal terminal. The second output circuit includes: a tenth transistor; a gate of the tenth transistor is electrically connected to the output terminal of the second isolation circuit, a first electrode of the tenth transistor is electrically connected to the first potential signal terminal, and a second electrode of the tenth transistor is electrically connected to the signal output terminal.

In some embodiments, the first isolation circuit includes: an eleventh transistor. A gate of the eleventh transistor is electrically connected to the first potential signal terminal, a first electrode of the eleventh transistor is electrically connected to the output terminal of the first node potential control circuit, and a second electrode of the eleventh transistor is electrically connected to the control terminal of the first output control circuit.

In some embodiments, the eleventh transistor is a dual-gate transistor.

In some embodiments, the eleventh transistor is an oxide semiconductor transistor.

In some embodiments, the second isolation circuit includes: a twelfth transistor. A gate of the twelfth transistor is electrically connected to the first potential signal terminal, a first electrode of the twelfth transistor is electrically connected to the output terminal of the input circuit, and a second electrode of the twelfth transistor is electrically connected to the control terminal of the second output circuit.

In some embodiments, the twelfth transistor is a dual-gate transistor.

In some embodiments, the twelfth transistor is an oxide semiconductor transistor.

In some embodiments, a signal of the signal output terminal of one stage of the shift register is provided to at least two of N rows of the pixel circuits in the display area.

DETAILED DESCRIPTION OF THE EMBODIMENTS

Figure 1:
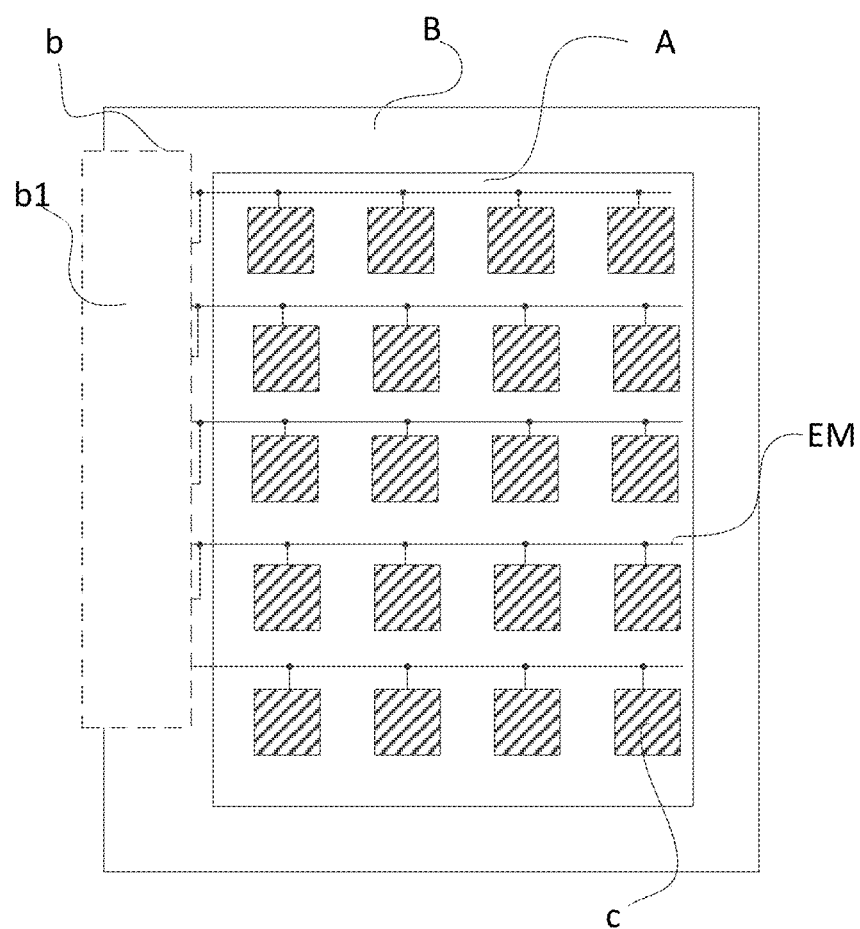
FIG. 1 is a schematic structural diagram of a display device according to an embodiment of the present disclosure.

Note that in this description, the description "connection" includes a case where elements are electrically connected, a case where elements are functionally connected, and a case where elements are directly connected. Therefore, in the structure disclosed in this description, another element may be sandwiched between elements having a predetermined connection relationship. For example, one or more elements (e.g., a switch, a transistor, a capacitor, an inductor, a resistor, and/or a diode) that enable electrical connection can be provided between a certain part and another part. In some embodiments, one or more circuits that enable functional connection can be provided between these parts, for example, a logic circuit (e.g., an inverter, a NAND circuit or a NOR circuit), a signal converter circuit (e.g., a digital-to-analog converter circuit, an analog-to-digital converter circuit, or a gradation correction circuit), a potential level converter circuit (e.g., a power supply circuit such as a voltage step-up circuit or a voltage step-down control circuit, or a level shifter circuit for changing a potential level of a high-level signal or a low-level signal), a voltage source, a current source, a switch circuit, or an amplifier circuit (e.g., a circuit which can increase a signal amplitude, the amount of current, or the like, such as an operational amplifier, a differential generator, a source output circuit, or a buffer circuit), a signal generation circuit, a memory circuit, or a control circuit. Alternatively, these elements may be directly connected without sandwiching other elements or other circuits.

For the case where elements are connected without sandwiching other elements or circuits therebetween, the description "direct connection" may be used. In some embodiments, in the cases of using "electric(al) connection", the following cases are included: a case where elements are electrically connected (i.e., a case where elements are connected by sandwiching other elements therebetween), a case where elements are functionally connected (i.e., elements are connected by sandwiching other circuits therebetween), and a case where elements are directly connected (i.e., elements are connected without sandwiching other elements or circuits therebetween).

Note that a display element, a display device, a light-emitting element, and a light-emitting device may adopt various types and include various elements. For example, the display element, the display device, the light-emitting element, and the light-emitting device may use a display medium whose contrast is changed by an electromagnetic action, such as an electroluminescent element (e.g., an organic electroluminescent element, an inorganic electroluminescent element, or an electroluminescent element including both organic and inorganic materials); an electron emitter; a liquid crystal element; electronic ink; a Grating Light Valve (GLV); a Plasma Display Panel (PDP); a Digital Micro-mirror Device (DMD); a piezoelectric ceramic display; or a carbon nanotube. Note that a display device using an electroluminescent element includes an electroluminescent display; a display device using an electron emitter includes a Field Emission Display (FED), and a Surface conduction Electron emitter Display (SED), etc.; a display device using a liquid crystal element includes a liquid crystal display, a transmissive liquid crystal display, a semi-transmissive liquid crystal display, a reflective liquid crystal display, etc.; and a display device using electronic ink includes electronic paper.

Note that in this description, various types of transistors may be used without being limited to specific types. Therefore, for example, a Thin Film Transistor (TFT) including a semiconductor film of non single crystalline silicon represented by amorphous silicon or polycrystalline silicon can be used. Therefore, such a transistor can be formed at a lower temperature than the case of using a semiconductor film of single crystalline silicon, and at lower cost. Such transistor further can be formed over a translucent substrate as well as a large-sized substrate to allow light to pass through. In some embodiments, such a transistor can be used to control transmission of light in a display element. Further, a transistor can be formed using a semiconductor substrate, a Silicon on Insulator (SOI) substrate, etc. Alternatively, a Metal Oxide Semiconductor (MOS) transistor, a junction transistor, a bipolar transistor, or the like may be used. Therefore, a transistor with a small change, a transistor with a high current supply capability, and a small-sized transistor can be provided to form a circuit with low power consumption. In some embodiments, a transistor including a compound semiconductor such as ZnO, a-InGaZnO, SiGe, or GaAs, a thin film transistor obtained by thinning such a compound semiconductor, or the like can be used. Therefore, such a transistor can be formed at a low temperature, or room temperature, and can be directly formed on a substrate with low thermal resistance such as a plastic substrate or a film substrate. In some embodiments, a transistor formed by an inkjet method or a printing method can also be used. Therefore, such a transistor can be formed at room temperature, under a low vacuum, and using a large-sized substrate. In some embodiments, since it is not necessary to use a mask (reticle) to form such a transistor, the layout of the transistor can be easily changed. In some embodiments, a transistor including an organic semiconductor or a carbon nanotube or other transistors may be used. As such, the transistor can be formed using a bendable substrate. Note that the semiconductor film of single crystalline silicon may include hydrogen or halogen. In some embodiments, a transistor can be formed using various types of substrates. The type of the substrate is not limited to a specific type. Therefore, for example, a single crystal substrate, an SOI substrate, a glass substrate, a quartz substrate, a plastic substrate, a paper substrate, a cellophane substrate, a stone substrate, a stainless steel substrate, a substrate including a stainless steel sheet, or the like can be used as the substrate. In some embodiments, one substrate may be used to form a transistor, and then the transistor is transferred to another substrate. Another substrate to which the transistor is to be transferred may be a single crystal substrate, an SOI substrate, a glass substrate, a quartz substrate, a plastic substrate, a paper substrate, a cellophane substrate, a stone substrate, a stainless steel substrate, a substrate including a stainless steel sheet, or the like. By using such a substrate, a transistor with excellent performance or a transistor with low power consumption can be formed, or a device with durability or high heat resistance can be formed.

The structure of the transistor may be in various types without being limited to a specific structure. For example, a multiple-gate structure having two or more gates may be used. When the multiple-gate structure is used, a structure in which channel regions are connected in series is provided, thus providing a structure in which a plurality of transistors are connected in series. By using the multiple-gate structure, the cutoff current can be reduced; the withstand voltage of the transistor can be increased to improve reliability. Although the drain-source voltage fluctuates when the transistor is operating in a saturation region, the drain-source current does not fluctuate significantly, so that flat characteristics can be obtained. In some embodiments, a structure in which middle-gate is formed above and below a channel can be used. By using the structure in which the middle-gate is formed above and below the channel, a channel region is enlarged to increase the amount of current flowing through the channel region, or a depletion layer can be easily formed to reduce S value. When the gate is formed above and below the channel, a structure in which a plurality of transistors are connected in parallel is provided.

In some embodiments, a structure in which the gate is formed above the channel, a structure in which the gate is formed below the channel, a staggered structure, a reverse staggered structure, a structure in which the channel region is divided into a plurality of regions, or a structure in which the gates are connected in parallel can be used. Source or drain may overlap the channel (or part of the channel). By using a structure in which the source or the drain may overlap the channel (or part of the channel), a situation in which charges accumulate in the part of the channel can be prevented, where such a situation will lead to unstable operation. In some embodiments, a structure with a Lightly Doped Drain (LDD) region may be used. By providing the LDD region, the cutoff current can be reduced; the withstand voltage of the transistor can be increased to improve reliability. Although the drain-source voltage fluctuates when the transistor is operating in a saturation region, the drain-source current does not fluctuate significantly, so that flat characteristics can be obtained.

Note that various types of transistors can be used in this description and the transistors can be formed using various types of substrates. Therefore, all circuits can be formed using a glass substrate, a plastic substrate, a single crystal substrate, an SOI substrate, or any other substrate. When all circuits are formed using the same substrate, the number of components can be reduced and the number of connections of circuit components can be reduced to improve reliability. Alternatively, part of the circuits may be formed using one substrate, and another part of the circuits may be formed using another substrate. That is to say, not all circuits are required to be formed using the same substrate. For example, part of the circuits can be formed with transistors using a glass substrate, and another part of the circuits can be formed using a single crystal substrate. The IC chip can thus be connected by directly bonding to the glass substrate (Chip on Glass (COG)). Alternatively, by tape automated bonding (TAB), the IC chip may be connected to the glass substrate, or to a printed circuit board. When part of circuits are formed using the same substrate in this way, the number of components can be reduced and the number of connections of circuit components can be reduced to improve reliability. In some embodiments, by forming a portion having a high driving voltage or a portion having a high driving frequency on another substrate, an increase in power consumption can be prevented.

In some embodiments, one pixel corresponds to one element of which brightness can be controlled. Therefore, for example, one pixel corresponds to one color element and the brightness is controlled using the one color element. Therefore, in the case of a color display device having R (red), G (green), and B (blue) color elements, the smallest unit of an image is formed by three pixels: R pixel, G pixel, and B pixel. Note that the color elements are not limited to three colors, and color elements of more than three colors may be used or colors other than RGB may be added. For example, by adding white, RGBW (W corresponding to white) can be used. In some embodiments, RGB plus one or more colors of yellow, cyan, magenta, emerald green, vermilion, and the like may be used. In some embodiments, R, G, B1 and B2 can be used. Although B1 and B2 are blue, they have slightly different frequencies. By using such a color element, display closer to a real object can be performed or power consumption can be reduced. Alternatively, as another example, in the case of controlling the brightness of one color element by using a plurality of areas, one area corresponds to one pixel. Therefore, for example, in the case of performing area gray-scale display, a plurality of areas for controlling brightness are provided in each color element and all areas are used to express gray-scale. In this case, one area for controlling brightness corresponds to one pixel. Therefore, in this case, one color element includes a plurality of pixels. Furthermore, in this case, the area contributing to display may have different area sizes depending on pixels. In some embodiments, in a plurality of areas that control the brightness of each color element, that is, in a plurality of pixels forming one color element, signals applied to the plurality of pixels may be slightly changed, so that the viewing angle can be widened. Note that the description "one pixel (for three colors)" corresponds to the case where three pixels of R, and B are regarded as one pixel. Furthermore, the description "one pixel (for one color)" corresponds to the case where a plurality of pixels are provided in color elements and regarded as one pixel as a whole.

In some embodiments, pixels can be provided (arranged) in a matrix. Here, the description "pixels are provided (arranged) in a matrix" includes the case where the pixels are arranged in a straight line and the case where the pixels are arranged in a zigzag line in the longitudinal direction or the lateral direction. Therefore, for the case of performing full-color display using three color elements (e.g., RGB), the following cases are included: the case where pixels are arranged in stripes and the case where dots of the three color elements are arranged in a so-called delta pattern. In some embodiments, the case where the dots of the three color elements are provided in a Bayer arrangement is also included. Note that the color elements are not limited to three colors, and color elements of more than three colors may be used. Examples for this are RGBW (W corresponds to white); RGB plus one or more of yellow, cyan, magenta, etc. In some embodiments, the size of the display area between dots of color elements may vary. Therefore, power consumption can be reduced and the life of the light-emitting element can be extended.

In some embodiments, a transistor is an element having at least three terminals of a gate, a drain, and a source. The transistor has a channel region between a drain region and a source region, and current can flow through the drain region, the channel region, and the source region. Here, since the source and the drain of the transistor may vary according to the structure, operating conditions, and the like of the transistor, it is difficult to define which is the source or the drain. Therefore, in this description, a region that functions as a source and a drain cannot be called a source or a drain. For example, in this case, one of the source and the drain may be called a first terminal, and the other is called a second terminal. Also note that a transistor may be an element having at least three terminals of a base, an emitter and a collector. Also in this case, one of the emitter and collector may be similarly called a first terminal, and the other terminal may be called a second terminal.

The gate corresponds to all or part of the gate electrode and gate wiring (also referred to as gate line, gate signal line, etc.). The gate electrode corresponds to a conductive film that overlaps with a semiconductor film forming a channel region, an LDD (lightly doped drain) region, and the like, and a gate insulating film is sandwiched between the conductive film and the semiconductor film. The gate wiring corresponds to wiring for connecting gate electrodes of the respective pixels to each other or wiring for connecting a gate electrode to another wiring.

However, there is a portion that serves as both the gate electrode and the gate wiring. Such a region may be called either a gate electrode or a gate wiring. That is, there is a region where the gate electrode and the gate wiring cannot be clearly distinguished from each other. For example, in the case of a gate wiring in which a channel region overlaps and extends, the overlapping region serves as both a gate wiring and a gate electrode. Therefore, such a region may be called either a gate electrode or a gate wiring.

In some embodiments, a region formed of the same material as the gate electrode and connected to the gate electrode may also be called a gate electrode. Similarly, a region formed of the same material as the gate wiring and connected to the gate wiring can also be called a gate wiring. In some cases, such a region does not overlap the channel region, or does not have the function of connecting the gate electrode to another gate electrode. However, since a margin is provided at the time of manufacturing, there is a region formed of the same material as the gate electrode or the gate wiring and connected to the gate electrode or the gate wiring. Therefore, such a region may also be called either a gate electrode or a gate wiring.

In a transistor with multiple gates, for example, the gate electrode of one transistor is often connected to the gate electrode of another transistor by using a conductive film formed of the same material as the gate electrode. Since such a region is used for connecting the gate electrode to another gate electrode, this region can be called a gate wiring. In some embodiments, this region can also be called a gate electrode, because a transistor with multiple gates can also be regarded as one transistor. That is, a region formed of the same material as the gate electrode or gate wiring and connected to the gate electrode or gate wiring may be called a gate electrode or as a gate wiring. In some embodiments, for example, a part of the conductive film connecting the gate electrode and the gate wiring may also be called a gate electrode or a gate wiring.

In some embodiments, the gate electrode corresponds to a gate region or a part of the gate electrode, or a part or all of a region electrically connected to the gate electrode.

In some embodiments, the source corresponds to all or part of the source region, source electrode, and source wiring (also called source line, source signal line, etc.). The source region corresponds to a semiconductor region containing a large amount of p-type impurities (e.g., boron or gallium) or n-type impurities (e.g., phosphorus or arsenic). Therefore, a region containing a small amount of p-type impurities or n-type impurities, that is, an LDD (lightly doped drain) region is not included in the source region. The source electrode is a part of a conductive layer formed of a material different from the source region and electrically connected to the source region. However, there is a case where the source electrode and the source region are collectively called the source electrode. The source wiring is wiring for connecting source electrodes of the respective pixels to each other or wiring for connecting a source electrode to another wiring.

However, there is a portion that serves as both the source electrode and the source wiring. Such a region may be called either a source electrode or a source wiring. That is to say, there is a region where the source electrode and the source wiring cannot be clearly distinguished from each other. For example, in the case of a source wiring extends with overlapping a source region, the overlapping region serves as both a source wiring and a source electrode. Therefore, such a region may be called either a source electrode or a source wiring.

In some embodiments, a region formed of the same material as the source electrode and connected to the source electrode or a portion for connecting the source electrode to another source electrode may also be called a source electrode. The portion overlapping with the source region may also be called a source electrode. Similarly, a region formed of the same material as the source wiring and connected to the source wiring can also be called a source wiring. In some cases, such a region does not have the function of connecting the source electrode to another source electrode. However, since a margin is provided at the time of manufacturing, there is a region formed of the same material as the source electrode or the source wiring and connected to the source electrode or the source wiring. Therefore, such a region may also be called either a source electrode or a source wiring.

In some embodiments, a part of the conductive film connecting the source electrode and the source wiring may be called a source electrode or a source wiring.

In some embodiments, the source terminal corresponds to a part of the source region or the source electrode, or a part or all of a region electrically connected to the source electrode.

Here, the above description also applies to the drain.

In this description, a semiconductor device corresponds to a device having a circuit including a semiconductor element (e.g., a transistor or a diode). The semiconductor device may also include all devices that function by utilizing semiconductor characteristics. In some embodiments, a display device corresponds to a device having a display element (e.g., a liquid crystal element or a light-emitting element). In some embodiments, the display device may also correspond to the display panel itself, where a plurality of pixels including a display element such as a liquid crystal element or an electroluminescent element are formed on the same substrate as a peripheral driver circuit for driving the pixels. In some embodiments, the display device may further include a peripheral driver circuit provided on the substrate by wire bonding or bump bonding, that is, an IC chip connected by a chip on glass (COG) or the like. In some embodiments, the display device may further include a Flexible Printed Circuit (FPC) or a Printed Wiring Board (PWB) to which an IC, a resistor, a capacitor, an inductor, a transistor, or the like is attached. The display device may further include an optical sheet such as a polarizing sheet or a retardation sheet. In some embodiments, the display device may include a backlight unit (the backlight unit may include a light guide plate, a prism sheet, a diffusion sheet, a reflection sheet, or a light source (e.g., an LED or cold cathode tube)). Furthermore, the light-emitting device corresponds to a display device having a self-light emitting display element, particularly, an element such as an electroluminescent element or an element for Field Emission Display (FED). The liquid crystal display device corresponds to a display device having a liquid crystal element.

In this description, describing the relationship between an object and another object as "formed on" or "formed above" does not necessarily mean that the object is formed in direct contact with the other object. The description includes a case where two objects are not in direct contact, that is, a case where another object is sandwiched between the two objects. Thus, for example, when describing that layer B is formed on (or above) layer A, this includes a case where layer B is formed in direct contact with layer A, and a case where another layer (e.g., layer C or layer D) is formed in direct contact with layer A, and layer B is formed in direct contact with layer C or D. Similarly, when it is described that an object is formed above another object, it does not necessarily mean that the object is in direct contact with another object, and other objects may be sandwiched therebetween. Thus, for example, when describing that layer B is formed under (or below) layer A, this includes a case where layer B is formed in direct contact with layer A, and a case where another layer (e.g., layer C or layer D) is formed in direct contact with layer A, and layer B is formed in direct contact with layer C or D. Similarly, when it is described that one object is formed under or below another object, this includes a case where these objects are in direct contact with each other and a case where these objects are not in direct contact with each other.

In the related art, in the field of organic electroluminescent display panels, it is usually necessary to additionally configure a separate light-emitting driving IC, and an output signal of the light-emitting driving IC is used for controlling a light-emitting control transistor of a pixel circuit in an organic electroluminescent display panel to control the on-off of a circuit between a driving transistor and a light-emitting diode in a light-emitting phase. However, the arrangement of the light-emitting driving IC occupies the frame area of the display panel, and also increases the production cost of the display panel.

Therefore, in the related art, a light-emitting driving circuit is disposed at the bezel region of the display panel to reduce the area occupied of the bezel of the display panel and the production cost. However, the stability of a signal output by the light-emitting driving circuit in the related art is not good, and the potential of the control node is susceptible to interference by other signals, which affects the display effect of the display panel.

The display device according to the embodiments of the present disclosure will be described in detail below with reference to the drawings.

An embodiment of the present disclosure provides a display device. As shown in FIG. 1, the display device includes: a plurality of pixel circuits c located in a display area A, the plurality of pixel circuits including N rows of pixel circuit groups, and each row of pixel circuit groups including M pixel circuits, where N and M are positive integers; and a light-emitting driving circuit b located in a non-display area B, the light-emitting driving circuit b including a plurality of cascaded shift registers b1. Here a signal output terminal of each stage of the plurality of shift registers except a last stage is electrically connected to an input signal terminal of a next stage of shift register adjacent thereto, and each stage of the plurality of shift registers is connected to at least one of the N rows of pixel circuit groups through a light-emitting control line.

As shown in FIGS. 2A-2E, each of the plurality of cascaded shift registers includes: an input circuit 1, a first node potential control circuit 2, a second node potential control circuit 3, a first isolation circuit 4, a second isolation circuit 5, a first output control circuit 6, a second output control circuit 7, a capacitor circuit 8, a first output circuit 9 and a second output circuit 10.

The input circuit 1 is configured to provide a signal of an input signal terminal STV to an input terminal of the second isolation circuit 5 under control of the signal of a first clock signal terminal CK.

The first node potential control circuit 2 is configured to provide a first potential signal of a first potential signal terminal VGL to an input terminal of the first isolation circuit 4 under control of the signal of the first clock signal terminal CK, and provide a first clock signal of the first clock signal terminal potential CK to the input terminal of the first isolation circuit 4 under control of the signal of the input terminal of the second isolation circuit 5.

The second node potential control circuit 3 is configured to provide a second potential signal of a second potential signal terminal VGH to the input terminal or an output terminal of the second isolation circuit 5 under control of a signal of the input terminal or an output terminal of the first isolation circuit 4.

The first isolation circuit 4 is configured to isolate a potential of the input terminal of the first isolation circuit 4 from a potential of the output terminal of the first isolation circuit 4 under control of signal of the first potential signal terminal VGL.

The second isolation circuit 5 is configured to isolate a potential of the input terminal of the second isolation circuit 5 from a potential of a control terminal of the second output circuit 10 under control of the signal of the first potential signal terminal VGL.

The first output control circuit 6 is configured to provide the second clock signal to a control terminal of the first output circuit 9 under control of the signals of the output terminal of the first isolation circuit 4 and a second clock signal terminal CKB.

The second output control circuit 7 is configured to control the potential of the control terminal of the second output circuit 10 under control of the signal of the second clock signal terminal CKB.

The first output circuit 9 is configured to provide a signal of the second potential signal terminal VGH to the signal output terminal OUT under control of the potential of the control terminal of the first output circuit 9.

The second output circuit 10 is configured to provide the signal of the first potential signal terminal VGL to the signal output terminal OUT under control of the potential of the control terminal of the second output circuit 10, where the signal output terminal OUT is electrically connected to the light-emitting control line EM.

Here as described above, the display device includes a plurality of pixel circuits located in a display area, and a light-emitting driving circuit located in a non-display area and electrically connected to the pixel circuits. The light-emitting driving circuit includes a plurality of cascaded shift registers; except a last stage of shift register, a signal output terminal of each stage of the plurality of shift registers is electrically connected to an input signal terminal of a next stage of shift register adjacent thereto. Here the shift register includes: an input circuit, a first node potential control circuit, a second node potential control circuit, a first isola-tion circuit, a second isolation circuit, a first output control circuit, a second output control circuit, a capacitor circuit, a first output circuit and a second output circuit. Through mutual cooperation of the circuits, the potentials of the control terminal of the first output control circuit and the control terminal of the second output circuit are kept stable without interference from other signals, thereby ensuring the stability of the output signal.

Figure 2A:
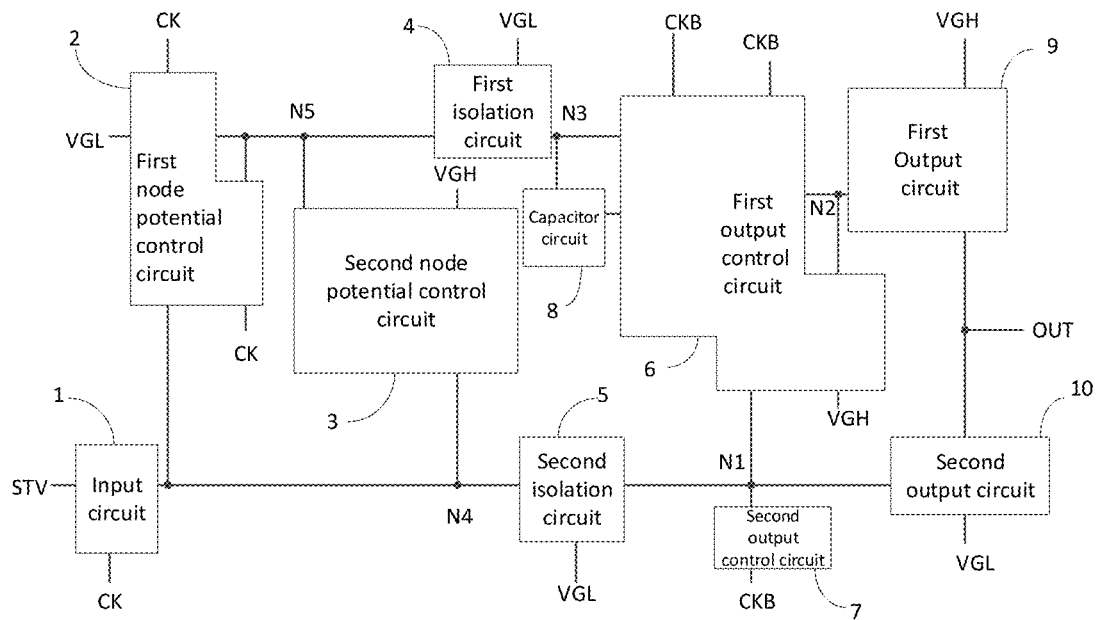
FIGS. 2A to 2E are schematic structural diagrams of a shift register according to an embodiment of the present disclosure.
Figure 2B:
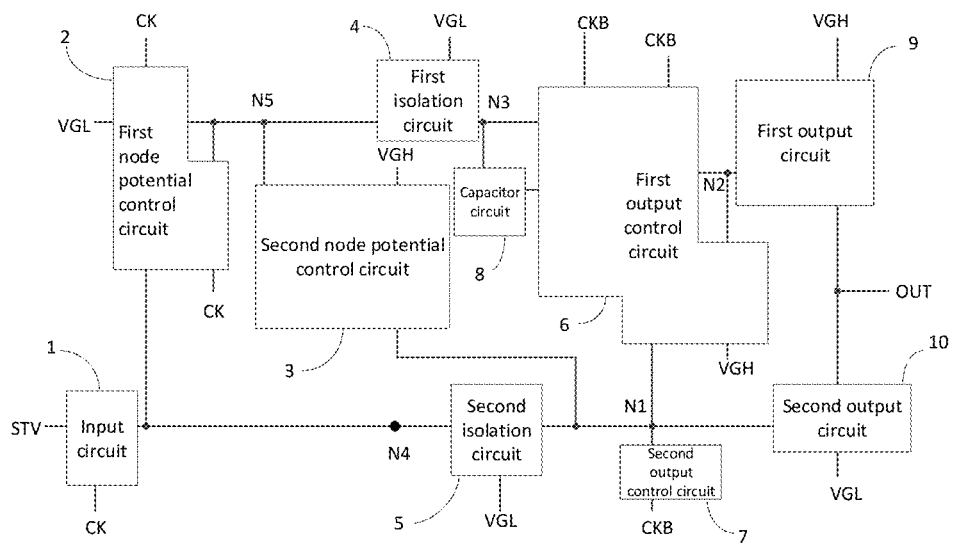
Figure 2C:
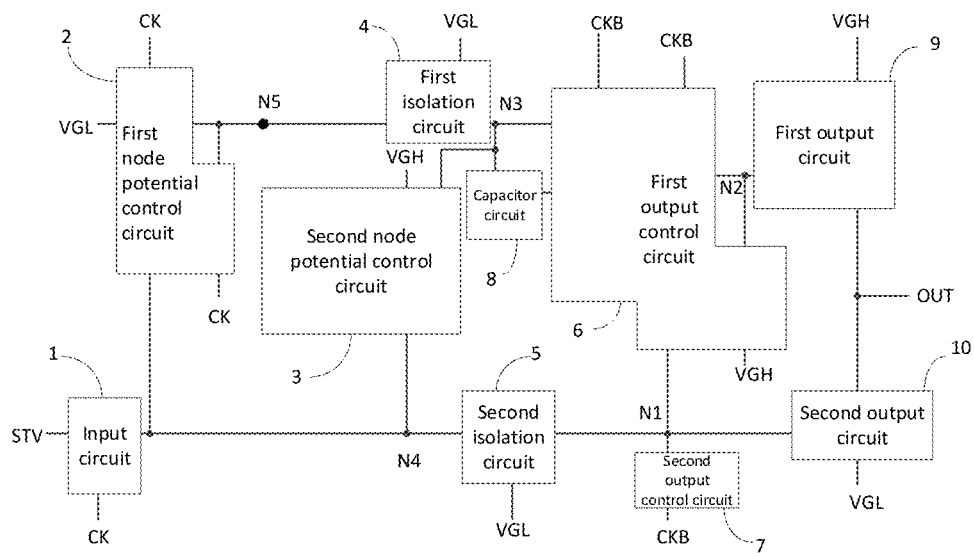
Figure 2D:
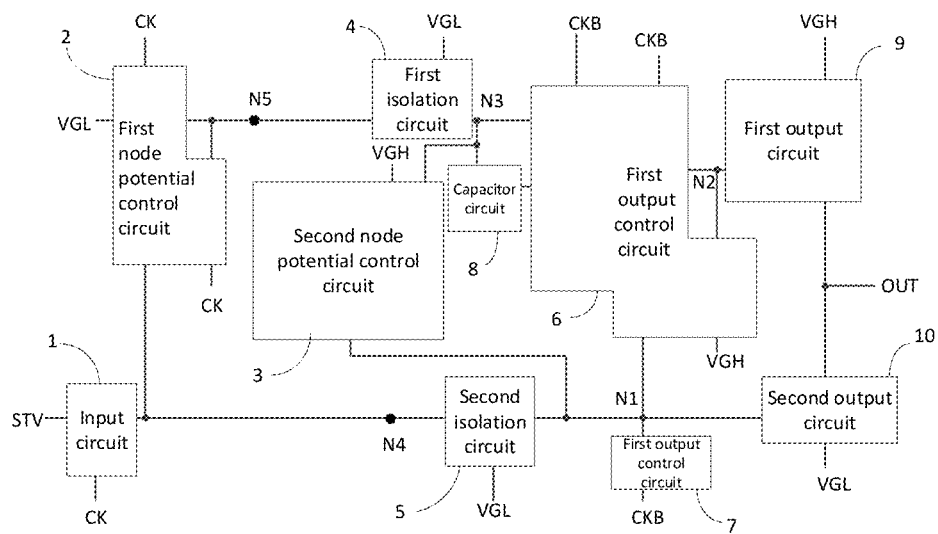

In some embodiments, as shown in FIGS. 2A to 2D, the first isolation circuit 4 is used to isolate potentials of a third node N3 from that of a fifth node N5 so that the potentials of the third node N3 and the fifth node N5 are not affected by each other. The second isolation circuit 5 is used to isolate potentials of a first node N1 from that of a fourth node N4 so that the potentials of the first node N1 and the fourth node N4 are not affected by each other. Therefore, the second node potential control circuit 3 may be connected between the fourth node N4 and the fifth node N5 as shown in FIG. 2A; may be connected between the first node N1 and the fifth node N5 as shown in FIG. 2B; may be connected between the third node N3 and the fourth node N4 as shown in FIG. 2C; and may be connected between the first node N1 and the third node N3 as shown in FIG. 2D. The working principle of several connection structures of the second node potential control circuit 3 is the same.

Figure 2E:
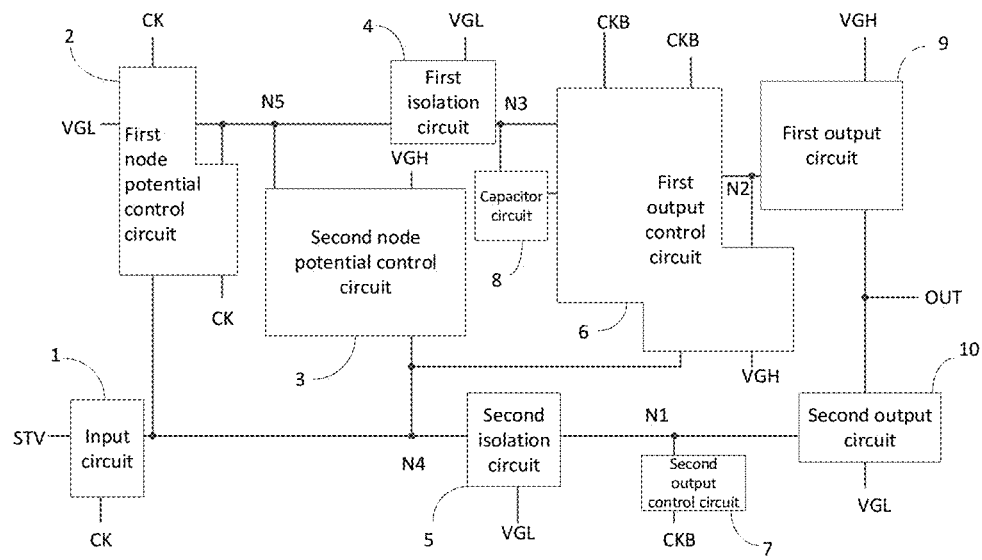

In some embodiments, as shown in FIGS. 2A to 2D, the first output control circuit 6 may have an electrical connection with the first node N1. In some embodiments, as shown in FIG. 2E, the first output control circuit 6 may have an electrical connection with the fourth node N4. The working principle in the cases the first output control circuit 6 is connected to the first node N1 or the fourth node N4 are the same.

Figure 3:
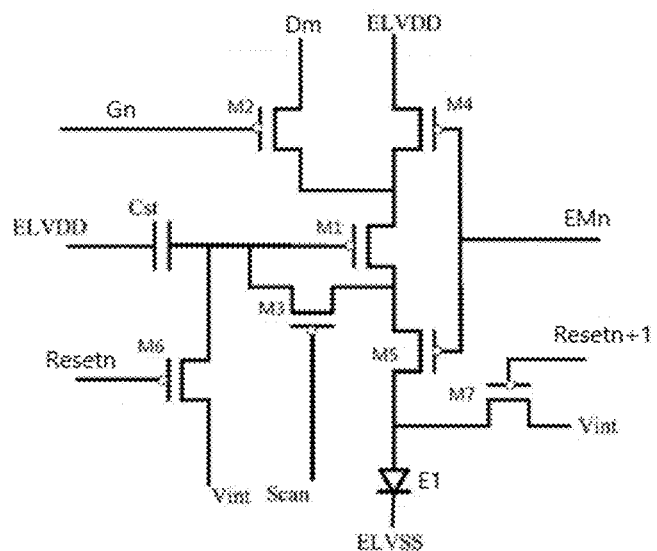
FIG. 3 is a schematic structural diagram of a pixel circuit according to an embodiment of the present disclosure.

As shown in FIG. 3, the display area further includes: a plurality of gate lines extending in a row direction, and a plurality of data lines extending in a column direction. In some embodiments, for a pixel circuit at position (n, m), where 1≤n≤N, 1≤m≤M, the pixel circuit may include: a first light-emitting element E1, a driving transistor M1, a data writing transistor M2, a compensation transistor M3, a first light-emitting control transistor M4, a second light-emitting control transistor M5, a first reset transistor M6, a second reset transistor M7, and a storage capacitor Cst. In FIG. 3, a power supply line is labeled ELVDD, a low-potential line is labeled ELVSS, and an initial potential line is labeled Vint. In the embodiment shown in FIG. 3, the voltage lines includes a power supply line ELVDD, a low-potential line ELVSS, and an initial potential line Vint.

In FIG. 3, an nth row of gate line is labeled Gn, an nth row of reset line is labeled Resetn, an (n+1)th row of reset line is labeled Resetn+1, an mth column of data line is labeled Dm.

The first light-emitting element E1 is an organic light-emitting diode.

A first electrode of the driving transistor M1 is electrically connected to the power supply line ELVDD through the first light-emitting control transistor M4; a second electrode of the driving transistor M1 is electrically connected to an anode of the first light-emitting element E1 through the second light-emitting control transistor M5.

A control electrode of the first light-emitting control transistor M4 and a control electrode of the second light-emitting control transistor M5 are electrically connected to the nth row of light-emitting control line EMn.

A control electrode of the data writing transistor M2 is electrically connected to an nth row of gate line Gn, and a first electrode of the data writing transistor M2 is electrically connected to an mth column of data line Dm, and a second electrode of the data writing transistor M2 is electrically connected to the first electrode of the driving transistor M1.

A control electrode of the compensation transistor M3 is electrically connected to the nth row of gate line Gn, and a first electrode of the compensation transistor M3 is electrically connected to a control electrode of the driving transistor M1, and a second electrode of the compensation transistor M3 is electrically connected to the second electrode of the driving transistor M1.

A first terminal of the storage capacitor Cst is electrically connected to the power supply line ELVDD, and a second terminal of the storage capacitor Cst is electrically connected to the control electrode of the driving transistor M1.

A control electrode of the first reset transistor M6 is electrically connected to an nth row of reset line, a first electrode of the first reset transistor M6 is electrically connected to the control electrode of the driving transistor M1, and a second electrode of the first reset transistor M6 is electrically connected to the initial potential line Vint.

A control electrode of the second reset transistor M7 is electrically connected to a (n+1)th row of reset line Resetn+1, a first electrode of the second reset transistor M7 is electrically connected to the anode of the first light-emitting element E1, and a second electrode of the second reset transistor M7 is electrically connected to the initial potential line Vint; and a cathode of the first light-emitting element E1 is electrically connected to the low-potential line ELVSS.

It should be noted that the plurality of pixel circuits according to an embodiment of the present disclosure include N rows of pixel circuit groups, and each row of pixel circuit groups includes M pixel circuits, that is, the plurality of pixel circuits are arranged in an N×M matrix. The above embodiment is described by taking one pixel circuit among the N×M matrix as an example, that is, taking a pixel circuit with coordinates (n, m) as an example, where 1≤n≤N, 1≤m≤M.

In the embodiment shown in FIG. 3, each transistor may be a p-type thin film transistor, but not limited thereto.

In some embodiments, the pixel circuit shown in FIG. 3 works as follows.

M4 and M5 are turned on or off under control of a light-emitting control signal provided by EMn;

M2 controls the writing of the data potential on Dm to the first electrode of M1 under control of a gate driving signal provided by Gn, and M3 controls compensation of the threshold potential of M1 under control of the gate driving signal provided by Gn;

M6 controls the writing of the initial potential provided by Vint to the control electrode of M1 under control of a first reset signal provided by Resetn;

M7 controls the writing of the initial potential provided by Vint to the anode of E1 under control of a second reset signal provided by Resetn+1.

In some embodiments the first reset signal and the second reset signal may be the same; in other embodiments, the first reset signal and the second reset signal may also be different.

In some embodiments, the first reset signal may be a gate driving signal of an adjacent preceding stage, and the second reset signal may be a gate driving signal, but not limited thereto.

The embodiment of the pixel circuit shown in FIG. 3 is an exemplary embodiment. In some embodiments, structures of the pixel circuit may be other circuit structures. For example, a structure of the pixel circuit may further include a stabilizing capacitor. A first terminal of the stabilizing capacitor is electrically connected to the data line, and a second terminal of the stabilizing capacitor is electrically connected to the power supply line.

The pixel circuit in the embodiment shown in FIG. 3 may be an nth row and mth column pixel circuit, where m and n are positive integers. In FIG. 3, the nth row and mth column pixel driving circuit includes M1, M2, M3, M4, M5, M6, M7, and Cst.

Figure 4A:
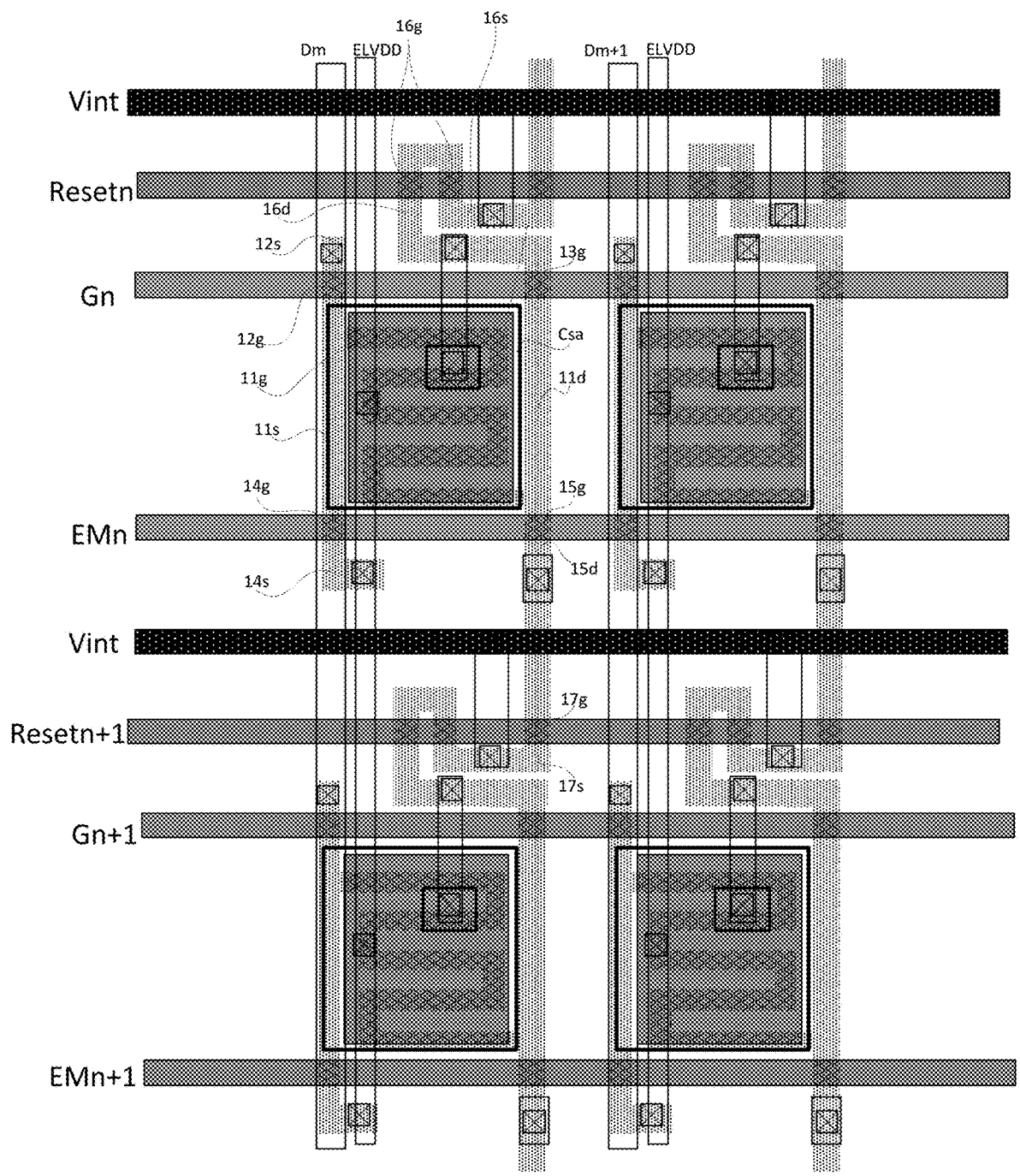
FIG. 4A is a schematic diagram illustrating the layout of transistors and storage capacitors in a pixel circuit included in a display device according to an embodiment of the present disclosure.

FIG. 4A is a schematic diagram illustrating the layout of transistors and storage capacitors in a display substrate according to an embodiment of the present disclosure. As shown in FIG. 4A, from a top view, there are an active layer, a first gate metal layer, a second gate metal layer, and a first source-drain metal layer from bottom to top. In FIG. 4A, an mth column of data line is labeled Dm, an m+1th column of data line is labeled Dm+1, a power supply line is labeled ELVDD, an initial potential line is labeled Vint, an nth row of reset line is labeled Resetn, an (n+1)th row of reset line is labeled Resetn+1, an nth row of light-emitting control line is labeled EMn, an (n+1)th row of light-emitting control line is labeled EMn+1, an nth row of gate line is labeled Gn, and an (n+1)th row of gate line is labeled Gn+1.

In FIG. 4A, a channel region of an active layer pattern of M6 is labeled 16g, a source region of the active layer pattern of M6 is labeled 16s, and a drain region of the active layer pattern of M6 is labeled 16d. A channel region of an active layer pattern of M3 is labeled 13g. A channel region of an active layer pattern of M1 is labeled 11g, a drain region of the active layer pattern of M1 is labeled 11d, and a source region of the active layer pattern of M1 is labeled 11s. A channel region of an active layer pattern of M2 is labeled 12g, and a source region of the active layer pattern of M2 is labeled 12s. A channel region of an active layer pattern of M4 is labeled 14g, and a source region of the active layer pattern of M4 is labeled 14s. A channel region of an active layer pattern of M5 is labeled 15g, and a drain region of the active layer pattern of M5 is labeled 15d. A channel region of an active layer pattern of M7 is labeled 17g, and a source region of the active layer pattern of M7 is labeled 17s. A first plate of the storage capacitor Cst is labeled Csa.

The width-to-length ratio of the channel region 11g of the driving transistor M1 is smaller than the width-to-length ratio of the channel region 14g of the first light-emitting control transistor M4, and the width-to-length ratio of the channel region 11g of the driving transistor M1 is smaller than the width-to-length ratio of the channel region 15g of the second light-emitting control transistor M5.

Figure 4B:
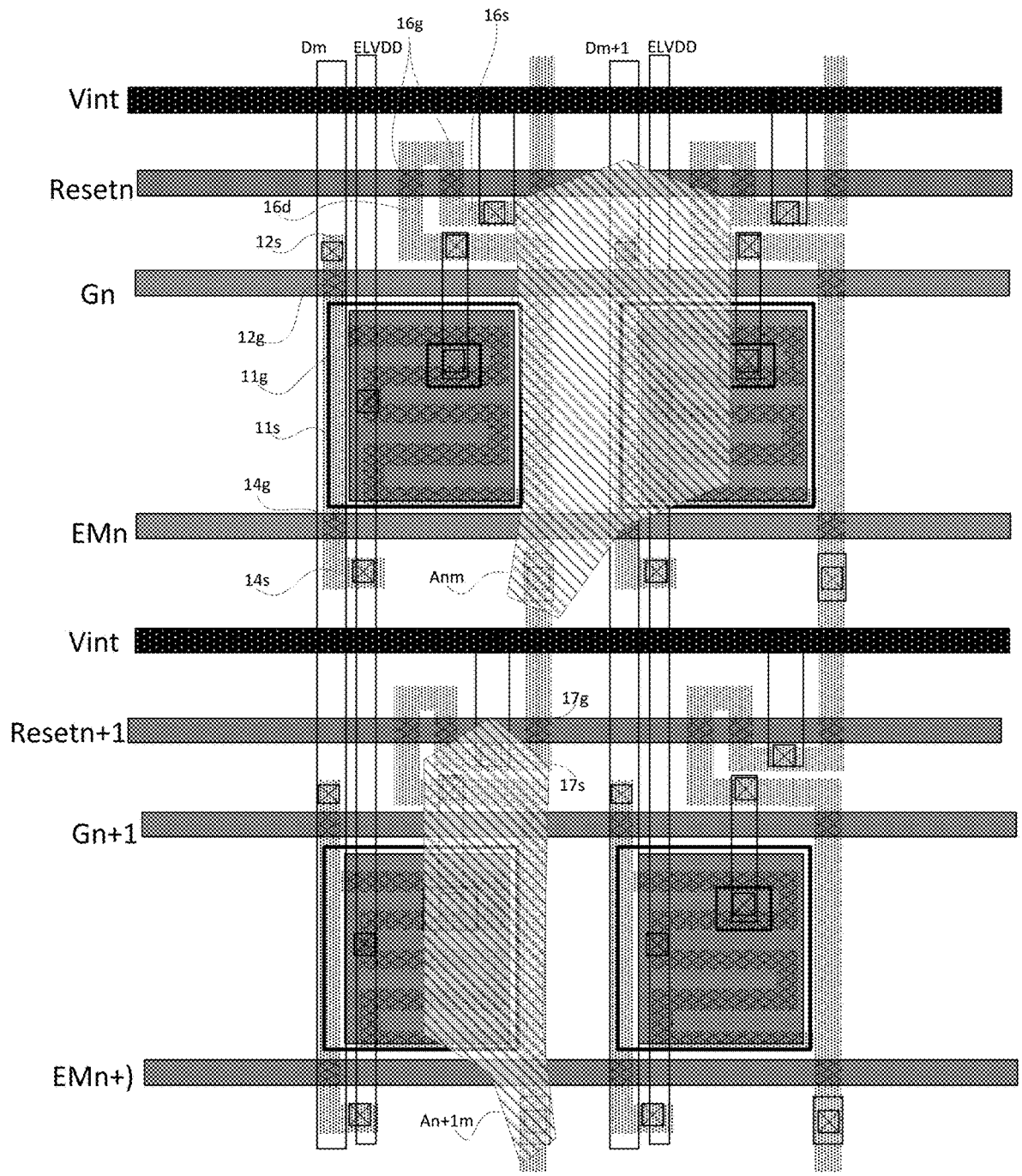
FIG. 4B is a schematic diagram illustrating the layout of an anode, a transistor and a storage capacitor in a pixel circuit included in a display device according to an embodiment of the present disclosure.

An anode Anm of the first light-emitting element included in the pixel circuit in the nth row and the mth column, and an anode An+1m of the first light-emitting element included in the pixel circuit in the (n+1)th row and the mth column are added in the structure shown in FIG. 4B on the basis of that shown in FIG. 4A.

It can be seen from FIG. 4B that the area occupied by Anm is not equal to the area occupied by the pixel driving circuit in the nth row and the mth column; Anm may not be completely set in the pixel area of the nth row and the mth column; the pixel area of the nth row and the mth column may be an area surrounded by Resetn, Resetn+1, Dm, and Dm+1, but not limited thereto.

It should be noted that, in the display device according to an embodiment of the present disclosure, a data potential provided to the data signal line Dm is between a high potential provided to the power supply line ELVDD and a low potential provided to the low-potential line ELVSS; the potential provided by the second potential signal terminal VGH connected to the first output circuit 9 is greater than the high potential provided to the power supply line ELVDD, and the potential provided by the first potential signal terminal VGL connected to the second output circuit 10 is between the high potential provided to the power supply line ELVDD and the low potential provided to the low-potential line ELVSS. Here the potential provided to the second potential signal terminal VGH is the same as the high potential of the clock signal provided to the first clock signal terminal CK or the second clock signal terminal CKB, or the difference therebetween is within the range of 0.1V. The potential provided to the first potential signal terminal VGL is the same as the low potential of the clock signal provided to the first clock signal terminal CK or the second clock signal terminal CKB, or the difference therebetween is within the range of 0.1V. The intermediate potential value output from the output terminal of each shift register is greater than the potential provided to the first potential signal terminal VGL.

The present disclosure will be described in detail below with reference to specific embodiments. It should be noted that the embodiments are for better explanation of the present disclosure, but do not limit the present disclosure.

In some embodiments, as shown in FIGS. 5A to 5E, the input circuit 1 includes: a first transistor T1.

A gate of the first transistor T1 is electrically connected to the first clock signal terminal CK, and a first electrode of the first transistor T1 is electrically connected to the input signal terminal STV, and a second electrode of the first transistor T1 is electrically connected to the input terminal of the first isolation circuit 4 and the control terminal of the first node potential control circuit 2.

In some embodiments, as shown in FIGS. 5A to 5E, when the first clock signal terminal CK is at a low level, the first transistor T1 is turned on, and the signal of the input signal terminal STV is provided to the fourth node N4; when the first clock signal terminal CK is at a high level, the first transistor T1 is turned off.

In some embodiments, as shown in FIGS. 5A to 5E, the first node potential control circuit 2 includes: a second transistor T2 and a third transistor T3.

A gate of the second transistor T2 is electrically connected to an output terminal of the input circuit 1, a first electrode of the second transistor T2 is electrically connected to the first clock signal terminal CK, and a second electrode of the second transistor T2 is electrically connected to the input terminal of the first isolation circuit 4.

A gate of the third transistor T3 is electrically connected to the first clock signal terminal CK, a first electrode of the third transistor T3 is electrically connected to the first potential signal terminal VGL, and a second electrode of the third transistor T3 is electrically connected to the input terminal of the first isolation circuit 4.

In some embodiments, as shown in FIGS. 5A to 5E, in response to that the potential of the fourth node N4 is low, the second transistor T2 is turned on, the first clock signal of the first clock signal terminal CK is provided to the fifth node N5; in response to that the potential of the fourth node N4 is high, the second transistor T2 is turned off. Since the gate of the third transistor T3 is electrically connected to the first clock signal terminal CK, in response to that the first clock signal is at a low level, the third transistor T3 is turned on, the potential signal of the first potential signal terminal VGL is provided to the fifth node N5, and in response to that the first clock signal is at a high level, the third transistor T3 is turned off.

In some embodiments, as shown in FIGS. 5A to 5E and FIG. 8, the second node potential control circuit 3 includes: a fourth transistor T4 and a fifth transistor T5.

A gate of the fourth transistor T4 is electrically connected to a second electrode of the fifth transistor T5, a first electrode of the fourth transistor T4 is electrically connected to the second potential signal terminal VGH, and a second electrode of the fourth transistor T4 is electrically connected to the input terminal or the output terminal of the second isolation circuit 5.

A gate of the fifth transistor T5 is electrically connected to the input terminal or the output terminal of the first isolation circuit 4, and a first electrode of the fifth transistor T5 is electrically connected to the second clock signal terminal CKB.

Figure 5A:
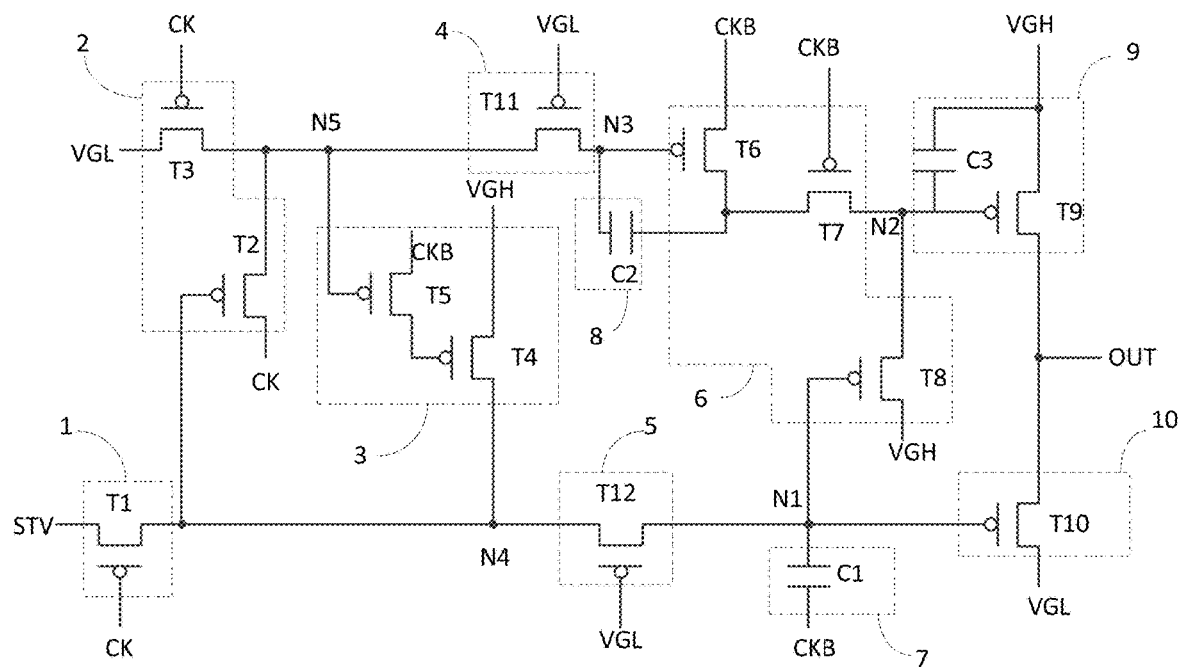
FIG. 5A is a schematic structural diagram of the shift register provided in FIG. 2A.
Figure 5B:
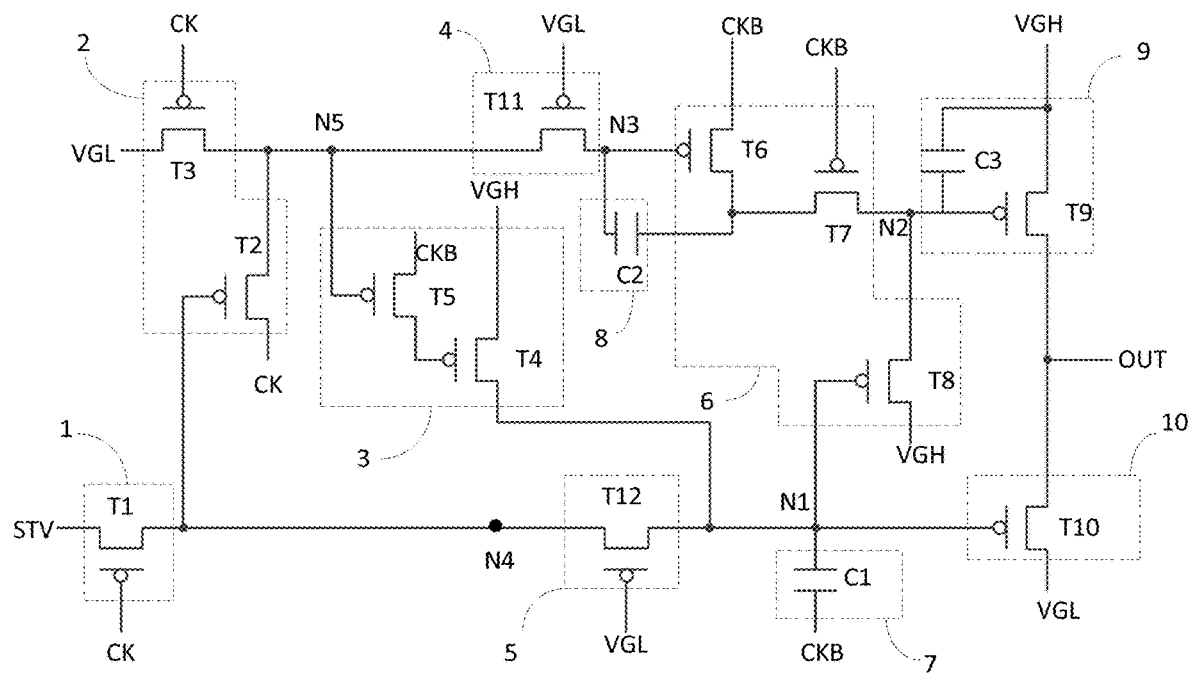
FIG. 5B is a schematic structural diagram of the shift register provided in FIG. 2B.
Figure 5C:
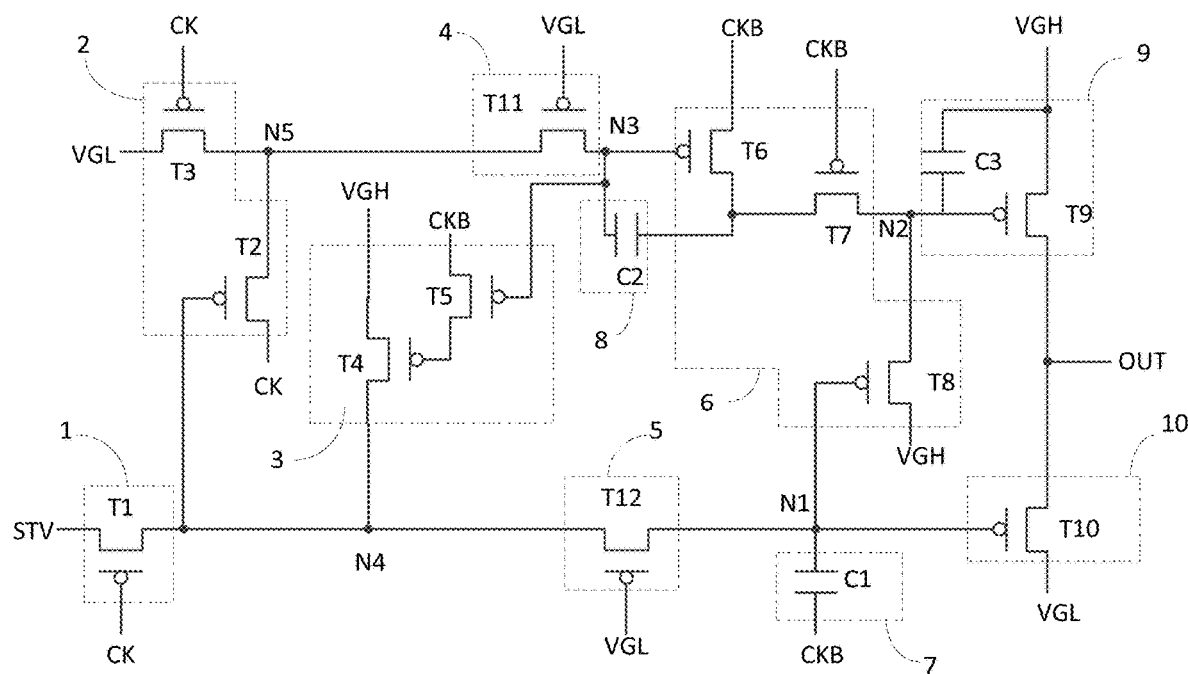
FIG. 5C is a schematic structural diagram of the shift register provided in FIG. 2C.
Figure 5D:
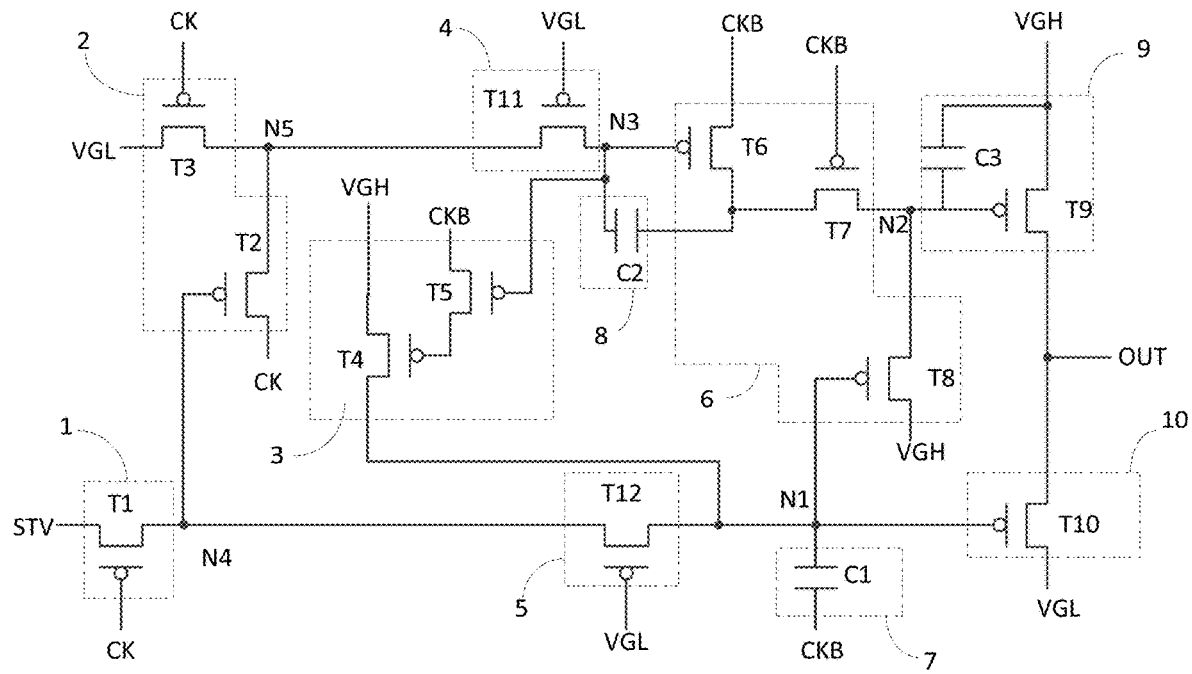
FIG. 5D is a schematic structural diagram of the shift register provided in FIG. 2D.

In some embodiments, as shown in FIG. 5A, in response to that the potential of the fifth node N5 is at a low level, the fifth transistor T5 is turned on and the second clock signal of the second clock signal terminal CKB is provided to the gate of the fourth transistor T4; in response to that the potential of the fifth node N5 is at a high level, the fifth transistor T5 is turned off. Since the gate of the fourth transistor T4 is electrically connected to the second electrode of the fifth transistor T5, in response to that the fifth transistor T5 is turned on, the signal of the second clock signal terminal CKB is provided to the gate of the fourth transistor T4. Therefore, in response to that the second clock signal is at a low level, the fourth transistor T4 is turned on and the signal of the second potential signal terminal VGH is provided to the fourth node N4, and in response to that the second clock signal is at a high level, the fourth transistor T4 is turned off.

Figure 6:
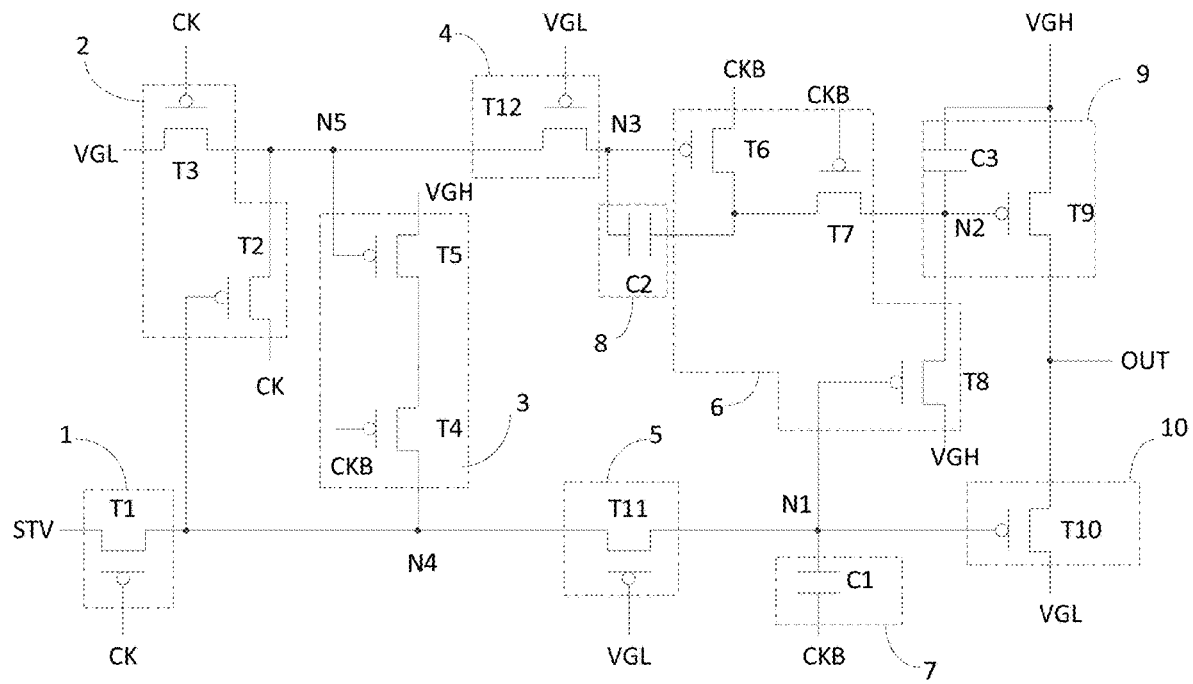
FIG. 6 is a schematic structural diagram of a shift register according to an embodiment of the present disclosure.
Figure 9:
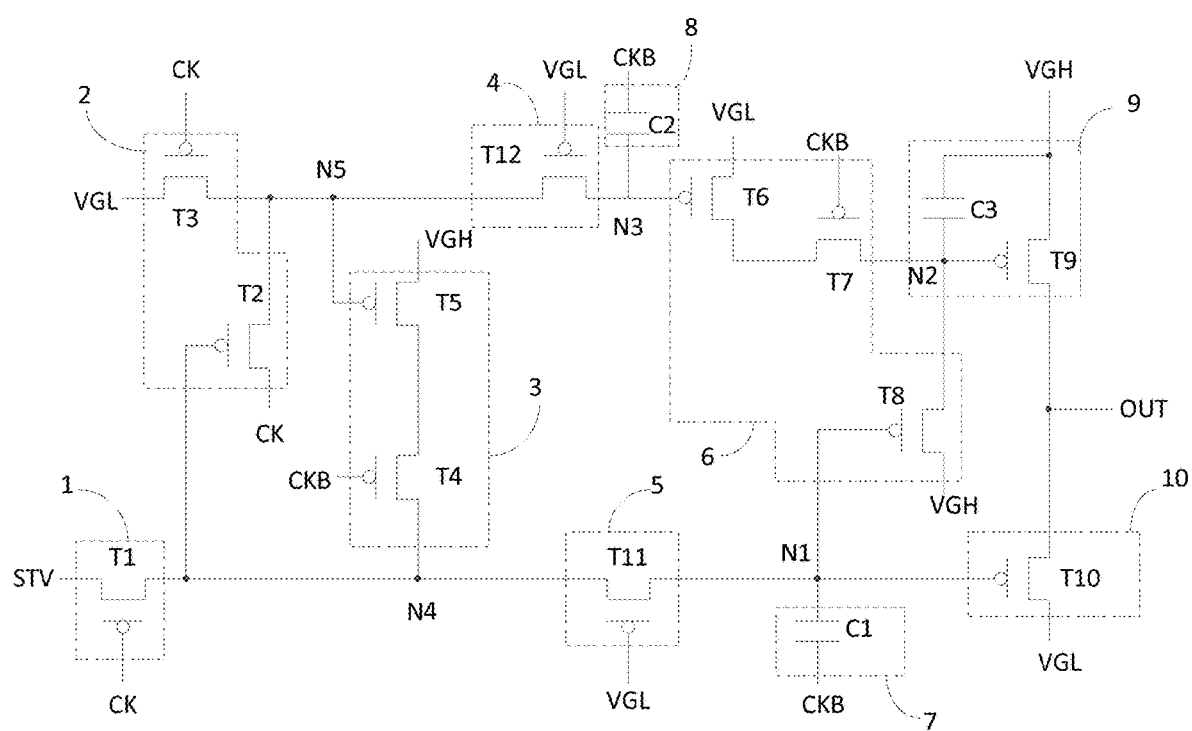
FIG. 9 is a schematic diagram of still another shift register according to an embodiment of the present disclosure.

In some embodiments, as shown in FIG. 6 and FIG. 9, the second node potential control circuit 3 includes: a fourth transistor T4 and a fifth transistor T5.

A gate of the fourth transistor T4 is electrically connected to the second clock signal terminal CKB, a first electrode of the fourth transistor T4 is electrically connected to a second electrode of the fifth transistor T5, and a second electrode of the fourth transistor T4 is electrically connected to the input terminal or the output terminal of the second isolation circuit 5.

A gate of the fifth transistor T5 is electrically connected to the input terminal or the output terminal of the first isolation circuit 4, and a first electrode of the fifth transistor T5 is electrically connected to the second potential signal terminal VGH.

In some embodiments, as shown in FIGS. 6 and 9, the gate of the fifth transistor T5 is electrically connected to the fifth node N5, and in response to that the fifth node N5 is at a low level, the fifth transistor T5 is turned on and the signal of the second potential signal terminal VGH is provided to the first electrode of the fourth transistor T4; and in response to that the potential of the fifth node N5 is at a high level, the fifth transistor T5 is turned off. The gate of the fourth transistor T4 is electrically connected to the second clock signal terminal CKB, and in response to that the second clock signal is at a low level, the fourth transistor T4 is turned on and the signal of the second potential signal terminal VGH via the fifth transistor T5 is provided to the fourth node N4, and in response to that the second clock signal is at a high level, the fourth transistor T4 is turned off.

Figure 8:
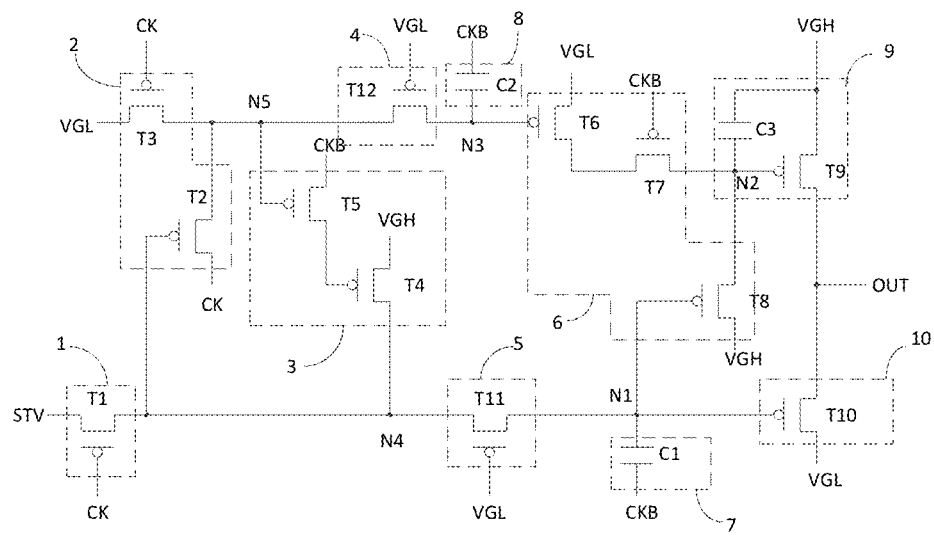
FIG. 8 is another schematic structural diagram of the shift register shown in FIG. 7.

It should be noted that, in the shift register according to an embodiment of the present disclosure, the second node potential control circuit 3 in the shift register shown in FIGS. 6, 8 and 9 may also have four connection types as shown in FIGS. 5A to 5D, which have the same design principle as the second node potential control circuit 3 shown in FIGS. 5A to 5D. Therefore, the second node potential control circuit 3 in FIG. 6, FIG. 8 and FIG. 9 can be designed by referring to the connection method of the second node potential control circuit 3 shown in FIGS. 5A to 5D, which will not be repeated here.

In some embodiments, in the shift register according to an embodiment of the present disclosure, as shown in FIGS. 5A to 5E, the first output control circuit 6 includes: a sixth transistor T6, a seventh transistor T7, and an eighth transistor T8.

A gate of the sixth transistor T6 is electrically connected to the output terminal of the first isolation circuit 4, a first electrode of the sixth transistor T6 is electrically connected to the second clock signal terminal CKB, and a second electrode of the sixth transistor T6 is electrically connected to a first electrode of the seventh transistor T7.

A gate of the seventh transistor T7 is electrically connected to the second clock signal terminal CKB, and a second electrode of the seventh transistor T7 is electrically connected to the control terminal of the first output circuit 9.

A gate of the eighth transistor T8 is electrically connected to the control terminal of the second output circuit 10 or the input terminal of the second isolation circuit 5, a first electrode of the eighth transistor T8 is electrically connected to the second potential signal terminal VGH, and a second electrode of the eighth transistor T8 is electrically connected to the control terminal of the first output circuit 9.

In some embodiments, as shown in FIGS. 5A to 5E, the gate of the sixth transistor T6 is electrically connected to the third node N3, and in response to that the potential of the third node N3 is at a low level, the sixth transistor T6 is turned on and the signal of the first potential signal terminal VGL is provided to the first electrode of the seventh transistor T7, and in response to that the third node N3 is at a high potential, the sixth transistor T6 is turned off; the gate of the seventh transistor T7 is electrically connected to the second clock signal terminal VGH, and in response to that the second clock signal is at a low level, the seventh transistor T7 is turned on, and the signal of the first potential signal terminal VGL via the sixth transistor T6 is provided to the second node N2 by the seventh transistor T7; in response to that the second clock signal is at a high level, the seventh transistor T7 is turned off. The gate of the eighth transistor T8 is electrically connected to the first node N1 or the fourth node N4. It should be noted that, comparing with the circuit shown in FIG. 5A, in the circuit shown in FIG. 5E, the gate connection mode of the eighth transistor varies. The manner in which the gate of the eighth transistor T8 is electrically connected to the first node N1 or the fourth node N4 may be applied to FIGS. 5B-5D. In response to that the potential of the first node N1 or the fourth node N4 is at a low level, the eighth transistor T8 is turned on to provide the signal of the second potential signal terminal VGH to the second node N2, and in response to that the first node N1 or the fourth node N4 is at a high potential, the eighth transistor T8 is turned off.

Figure 5E:
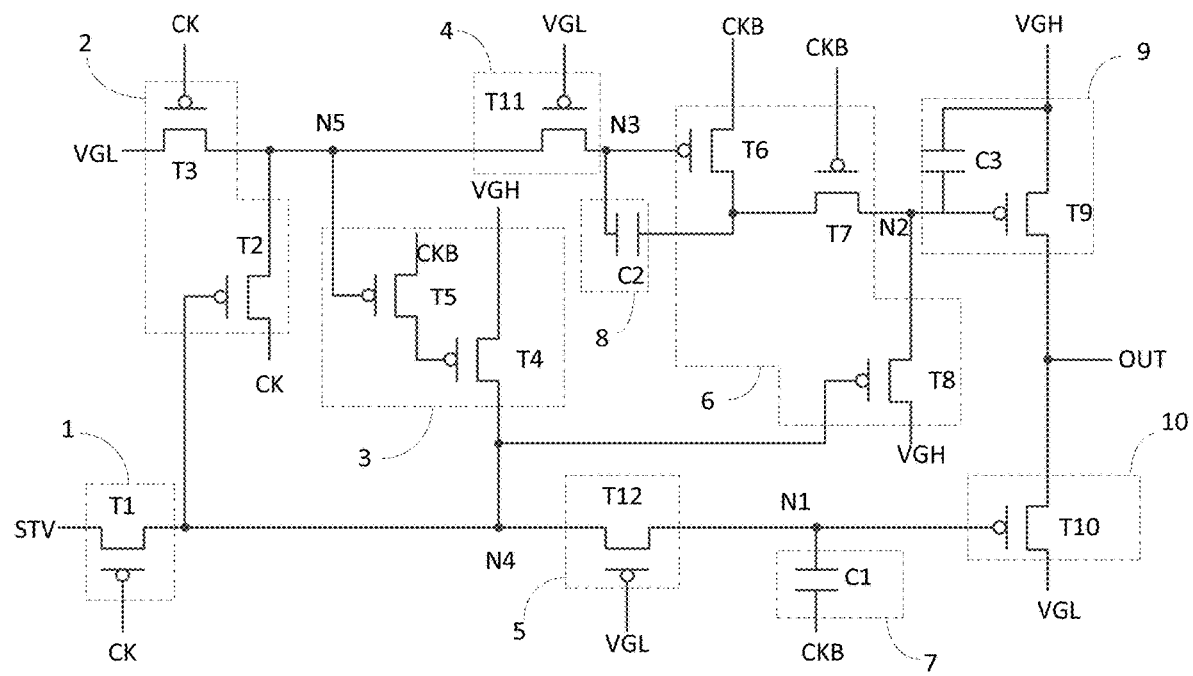
FIG. 5E is a schematic structural diagram of the shift register provided in FIG. 2E.

It should be noted that, in the shift register according to an embodiment of the present disclosure, the first output control circuit 6 in the shift register shown in FIGS. 6, 8 and 9 may also include the connection method shown in FIG. 5E, which has the same design principle as the first output control circuit 6 shown in FIG. 5E. Therefore, the first output control circuit 6 in FIG. 6, FIG. 8 and FIG. 9 can be designed by referring to the connection method of the first output control circuit 6 shown in FIG. 5E, which will not be repeated here.

In some embodiments, as shown in FIG. 8, the first output control circuit 6 includes: a sixth transistor T6, a seventh transistor T7 and an eighth transistor T8.

A gate of the sixth transistor T6 is electrically connected to the output terminal of the first isolation circuit 4, a first electrode of the sixth transistor T6 is electrically connected to the first potential signal terminal VGL, and a second electrode of the sixth transistor T6 is electrically connected to a first electrode of the seventh transistor T7.

A gate of the seventh transistor T7 is electrically connected to the second clock signal terminal CKB, and a second electrode of the seventh transistor T7 is electrically connected to the control terminal of the first output circuit 9.

A gate of the eighth transistor T8 is electrically connected to the control terminal of the second output circuit 10 or the input terminal of the second isolation circuit 5, a first electrode of the eighth transistor T8 is electrically connected to the second potential signal terminal VGH, and a second electrode of the eighth transistor T8 is electrically connected to the control terminal of the first output circuit 9.

In some embodiments, as shown in FIGS. 5A to 5E and FIGS. 6 to 9, the second output control circuit 7 includes: a first capacitor C1.

A first electrode of the first capacitor C1 is electrically connected to the second clock signal terminal CKB, and a second electrode of the first capacitor C1 is electrically connected to the control terminal of the second output circuit 10.

In some embodiments, the first capacitor C1 is connected between the second clock signal terminal CKB and the first node N1, and the potential of the first node N1 is controlled by the potential change of the second clock signal provided by the second clock signal terminal CKB, thereby controlling the switch state of the second output circuit 10.

In some embodiments, as shown in FIG. 2A, the capacitor circuit 8 is configured to control the potential of the output terminal of the first isolation circuit 4 under control of the first output control circuit 6.

In some embodiments, as shown in FIGS. 5A and 6 the capacitor circuit 8 includes: a second capacitor C2.

A first electrode of the second capacitor C2 is electrically connected to the output terminal of the first isolation circuit 4, and a second electrode of the second capacitor C2 is electrically connected to the first electrode of the seventh transistor T7.

In some embodiments, as shown in FIGS. 5A and 6, the first electrode of the second capacitor C2 is electrically connected to the third node N3, and the second electrode of the second capacitor C2 is electrically connected to the first electrode of the seventh transistor T7. With the second capacitor C2, the potential of the third node N3 can be adjusted to achieve the effect of controlling the switch state of the first output control circuit 6.

Figure 7:
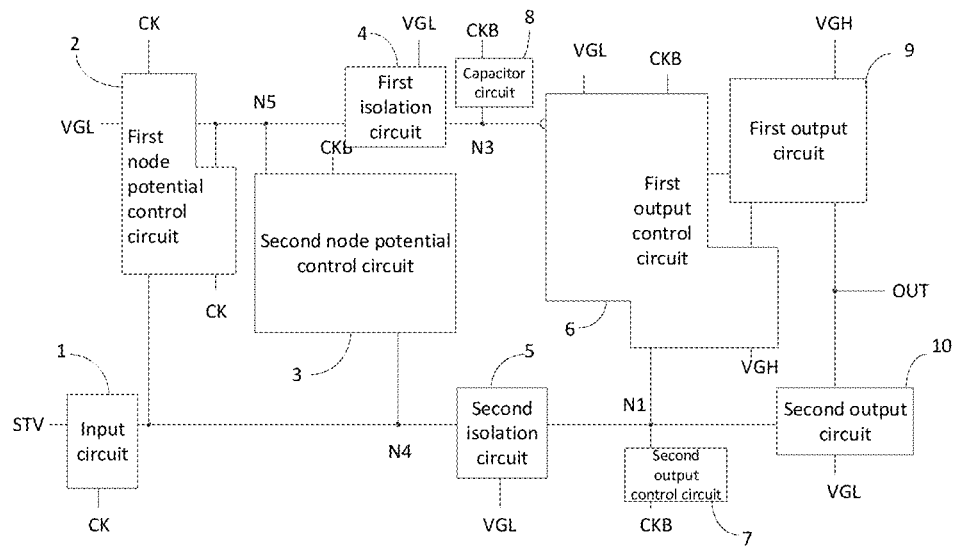
FIG. 7 is a schematic structural diagram of another shift register according to an embodiment of the present disclosure.

In some embodiments, as shown in FIG. 7, the capacitor circuit 8 is configured to control the potential of the output terminal of the first isolation circuit 4 under control of the second clock signal terminal CKB.

In some embodiments, as shown in FIGS. 8 and 9, the capacitor circuit 8 includes: a second capacitor C2.

A first electrode of the second capacitor C2 is electrically connected to the output terminal of the first isolation circuit 4, and a second electrode of the second capacitor C2 is electrically connected to the second clock signal terminal CKB.

In some embodiments, as shown in FIGS. 8 and 9, the first electrode of the second capacitor C2 is electrically connected to the third node N3, and the second electrode of the second capacitor C2 is electrically connected to the second clock signal terminal CKB. Due to the change of the potential of the second clock signal, the potential of the third node N3 is adjusted, thereby controlling the switch state of the first output control circuit 6.

In some embodiments, as shown in FIG. 5A, the first output circuit 9 includes: a ninth transistor T9 and a third capacitor C3.

A gate of the ninth transistor T9 is electrically connected to an output terminal of the first output control circuit 6, a first electrode of the ninth transistor T9 is electrically connected to the second potential signal terminal VGH, and a second electrode of the ninth transistor T9 is electrically connected to the signal output terminal OUT.

A first electrode of the third capacitor C3 is electrically connected to the gate of the ninth transistor T9, and a second electrode of the third capacitor C3 is electrically connected to the second potential signal terminal VGH.

In some embodiments, as shown in FIG. 5A, in response to that the second node N2 is at a low level, the ninth transistor T9 is turned on and the signal of the second potential signal terminal VGH is provided to the signal output terminal OUT, and in response to that the second node N2 is at a high level, the ninth transistor T9 is turned off. The third capacitor C3 is located between the second node N2 and the second potential signal terminal VGH, and serves to stabilize the potential of the second node N2.

In some embodiments, as shown in FIG. 5A, the second output circuit 10 includes: a tenth transistor T10.

A gate of the tenth transistor T10 is electrically connected to the output terminal of the second isolation circuit 5, a first electrode of the tenth transistor T10 is electrically connected to the first potential signal terminal VGL, and a second electrode of the tenth transistor T10 is electrically connected to the signal output terminal OUT.

In some embodiments, as shown in FIG. 5A, in response to that the potential of the first node N1 is at a low level, the tenth transistor T10 is turned on and the signal of the first potential signal terminal VGL is provided to the signal output terminal OUT, and in response to that the potential of the first node N1 is at a high level, the tenth transistor T10 is turned off.

In some embodiments, as shown in FIG. 5A, the first isolation circuit 4 includes: an eleventh transistor T11.

A gate of the eleventh transistor T11 is electrically connected to the first potential signal terminal VGL, a first electrode of the eleventh transistor T11 is electrically connected to the output terminal of the first node potential control circuit 2, and a second electrode of the eleventh transistor T11 is electrically connected to the control terminal of the first output control circuit 6.

In some embodiments, as shown in FIG. 5A, the eleventh transistor T11 makes a channel between the fifth node N5 and the third node N3 be conductive under control of the first potential signal terminal VGL. When a potential difference VGS between the gate of the eleventh transistor T11 and the first electrode of the eleventh transistor T11 or the second electrode of the eleventh transistor T11 is <VTH11, the eleventh transistor T11 is turned on, or otherwise is turned off. Therefore, it is in a normally-on state when the eleventh transistor T11 transmits a higher level, the eleventh transistor T11 is turned off only when the potential of the first electrode or the second electrode of the eleventh transistor T11 becomes low (VGS>VTH11). Here VTH11 represents a threshold potential of the eleventh transistor T11.

In order to reduce the leakage current of the third node N3, the eleventh transistor T11 may be set as a dual-gate transistor.

In some embodiments, as shown in FIG. 5A, the second isolation circuit 4 includes: a twelfth transistor T12.

A gate of the twelfth transistor T12 is electrically connected to the first potential signal terminal VGL, a first electrode of the twelfth transistor T12 is electrically connected to the output terminal of the input circuit 1, and a second electrode of the twelfth transistor T12 is electrically connected to the control terminal of the second output circuit 10.

In some embodiments, as shown in FIG. 5A, the twelfth transistor T12 makes a channel between the fourth node N4 and the first node N1 be conductive under control of the first potential signal terminal VGL, when a potential difference VGS between the gate of the twelfth transistor T12 and the first electrode of the twelfth transistor T12 or the second electrode of the twelfth transistor T12 is <VTH12, the twelfth transistor T12 is turned on, or otherwise is turned off. Therefore, it is in a normally-on state when the twelfth transistor T12 transmits a higher level, the twelfth transistor T12 is turned off only when the potential of the first electrode or the second electrode of the twelfth transistor T12 becomes low (VGS>VTH12). Here VTH12 represents a threshold potential of the twelfth transistor T12.

In order to reduce the leakage current of the first node N1, the twelfth transistor T12 may be set as a dual-gate transistor.

In some embodiments, in order to simplify the manufacturing process and reduce the manufacturing difficulty, multiple transistors may be set as low-temperature polysilicon transistors. The eleventh transistor and the twelfth transistor may also be provided as oxide semiconductor transistors, such as IGZO. Since the leakage current of the oxide semiconductor transistors is small, the leakage current of the third node and the first node can also be reduced, and the stability of the circuit can be improved.

The working process of the above shift register according to an embodiment of the present disclosure will be described below with reference to the shift register in FIG. 5A and the timing chart in FIG. 10, respectively. In the following description, 1 represents a high potential signal, 0 represents a low potential signal. Here 1 and 0 are respectively for indicating a high potential and a low potential, but do not represent that a potential of the high potential is 1, a potential of the low potential is 0. Specific potential values of the high potential and the low potential are selected according to actual situations, and are not limited herein. The signal of the first potential signal terminal VGL is at a low potential, and the signal of the second potential signal terminal VGH is at a high potential.

During stage t1: STV=1, CK=0, CKB=1, OUT=0.

Since the first clock signal of the first clock signal terminal CK is at a low potential, the first transistor T1 is turned on and the high potential signal of the input signal terminal STV is provided to the fourth node N4, thereby making the second transistor T2 be turned off. Since the gate of the twelfth transistor T12 is electrically connected to the first potential signal terminal VGL, the twelfth transistor T12 is turned on to provide the high potential signal of the fourth node N4 to the first node N1, thereby making the eighth transistor T8 and the tenth transistor T10 be turned off. Since the first clock signal of the first clock signal terminal CK is at a low potential, the third transistor T3 is turned on to provide the low potential signal of the first potential signal terminal VGL to the fifth node N5; the fifth node N5 is at a low potential, and the second clock signal is at a high potential, so that the fifth transistor T5 is turned on and the fourth transistor T4 is turned off. The eleventh transistor T11 in on state provides the low potential of the fifth node N5 to the third node N3; therefore, the sixth transistor T6 is turned on to provide the low potential signal of the first potential signal terminal VGL to the first electrode of the seventh transistor T7, Since the second clock signal is at a high potential, the seventh transistor T7 is turned off, the second node N2 is in a floating state to maintain the potential of the previous stage (a high potential), the ninth transistor T9 is turned off, and the signal output terminal OUT maintains the potential (a low potential) output at the previous moment.

During stage t2: STV=1, CK=1, CKB=0, OUT=1.

Since the first clock signal is at a high potential, the first transistor T1 and the third transistor T3 are turned off, the fourth node N4 maintains the high potential at the previous stage, and the second transistor T2, the eighth transistor T8 and the tenth transistor T10 are turned off; the potential of the second electrode of the sixth transistor T6 changes from a high level to low. Due to the bootstrap effect of the second capacitor C2, the potential of the third node N3 is pulled down. At this time, VGL-Vth12>0, T12 is turned off; the fifth node N5 and the third node N3 are disconnected, thereby ensuring that the third node N3 is not affected by other signals, i.e., not affecting the output of the sixth transistor T6. Terminal CKB and node N5 are at a low potential, transistors T4 and T5 are turned on, high potential from terminal VGH is written to node N4, T11 is turned on, and node N1 is at a high potential to ensure that transistor T10 does not output. The sixth transistor T6 is turned on under control of the third node N3 to provide the low potential signal of the second clock signal terminal CKB to the first electrode of the seventh transistor T7. Since the second clock signal is a low potential signal, the seventh transistor T7 is turned on to provide the low potential signal to the second node N2, so that the ninth transistor T9 is turned on. The ninth transistor T9 in on state provides the high potential signal of the second potential signal terminal VGH to the signal output terminal OUT, that is, the signal output terminal OUT outputs a high potential at this stage.

During stage t3: STV=1, CK=0, CKB=1, OUT=1.

Since the first clock signal is at a low potential, the first transistor T1 and the third transistor T3 are turned on, the first transistor T1 in on state provides the high potential signal of the input signal terminal STV to the fourth node N4, the first node N1 maintains a high potential, and the eighth transistor T8 and the tenth transistor T10 are turned off; the third node N3 is at a low potential, the sixth transistor T6 is turned on to provide the high potential signal of the second clock signal terminal CKB to the first electrode of the seventh transistor T7; since the second clock signal is a high potential signal, the seventh transistor T7 is turned off, the second node N2 maintains the potential of the previous stage (low potential), and the ninth transistor T9 remains being turned on to provide the high potential signal of the second potential signal terminal VGH to the signal output terminal OUT.

During stage t4: STV=0, CK=1, CKB=0, OUT=1.

At this stage, the first clock signal is a high level signal, the first transistor T1 and the third transistor T3 are turned off, and the fifth node N5 maintains the low potential of the previous stage; the fifth transistor T5 is turned on to provide the low potential signal of the second clock signal terminal CKB to the gate of the fourth transistor T4, and the fourth transistor T4 is turned on to provide the high level signal of the second potential signal terminal VGH to the fourth node N4; the first node N1 maintains the high potential of the previous stage, and the eighth transistor T8 and the tenth transistor T10 are turned off; the third node N3 maintains the low potential, the sixth transistor T6 and the seventh transistor T7 are turned on to provide the low potential signal to the second node N2, so that the ninth transistor T9 is turned on to provide the high potential signal of the second potential signal terminal VGH to the signal output terminal OUT.

During stage t5: STV=0, CK=0, CKB=1, OUT=0.

The first clock signal is a low potential signal, the first transistor T1 and the third transistor T3 are turned on; the first transistor T1 in on state provides the low potential signal of the input signal terminal STV to the fourth node N4 and writes it to the first node N1; at this time, the first node N1 is at a low potential, and the eighth transistor T8 and the tenth transistor T10 are turned on; the eighth transistor T8 in on state provides the high-potential signal of the second potential signal terminal VGH to the second node N2, so that the ninth transistor T9 is turned off; the tenth transistor T10 discharges the output terminal OUT to the first potential signal terminal VGL, and the potential of the output terminal OUT gradually decreases to VN1-Vth (T10), where VN1 is the potential of the N1 node, Vth (T10) is the threshold potential of transistor T10. Here transistor T10 is a P-type TFT. Vth (T10) is usually less than 0, VN1 and low potential $VSTV_L$ of terminal STV are basically the same, as VN1=$VSTV_L$. In the embodiment of the present disclosure, the low potential of terminal STV is set at the same potential of the first potential terminal VGL or with a difference of 0.1V If Vth(T10)<0.1V, the potential of the output terminal VN1-Vth(T10)>VGL, that is, the signal output terminal OUT outputs a low potential signal higher than VGL at this stage, and the intermediate potential value output by the output terminal is greater than the potential provided to the first potential signal terminal VGL.

During stage t6: STV=0, CK=1, CKB=0, OUT=0.

At this stage, the first clock signal is at a high potential, the first transistor T1 and the third transistor T3 are turned off; since the second clock signal changes from a high potential to a low potential, the potential of the first node N1 decreases due to the bootstrap effect of the first capacitor C1; at this time, the potential at node N1 drops to VN1=$VSTV_L$-($VCB_H$-$VCB_L$) from the basis of stage t5; alternatively, the potential provided to the second potential signal terminal VGH is the same as the high potential of the clock signal provided to the first clock signal terminal CK or the second clock signal terminal CKB, or the difference therebetween is within 0.1V (for example, the potentials at two node are between 5-8V); the potential provided to the first potential signal terminal VGL is the same as the low potential of the clock signal provided to the first clock signal terminal CK or the second clock signal terminal CKB, or the difference is within the range of 0.1V (for example, the potentials at the two nodes are between −5~−8V); VN1-VGL>Vth(T10), Vth(T10) is between (−4.5~-0.1V); at this time, the output end is pulled down to the same potential level as VGL. The potential at node N1 is much lower than VGL-Vth (T11), the eleventh transistor T11 is off, the first node N1 and the fourth node N4 are disconnected, and the potential of the first node N1 is prevented from being influenced by the leakage current, so that the first node N1 is floating. The eighth transistor T8 and the tenth transistor T10 are on. The eighth transistor T8 in on state provides the high potential signal of the second potential signal terminal VGH to the second node N2, so that the ninth transistor T9 is turned off, and the tenth transistor T10 in on state provides the low potential signal of the first potential signal terminal VGL to the signal output terminal OUT, that is, the signal output terminal OUT at this stage outputs the low potential signal. In some embodiments, node N4 remains at a low potential, potential of terminal CK becomes high before terminal CKB, T2 is turned on to write the high potential signal of terminal CK to node N5, so that node N5 becomes high, transistor T12 is turned on, and node N3 becomes high to ensure that T6 is turned off.

In the present disclosure, the frame signal STV and the output signal have different waveforms, and the output signal has an intermediate potential value that is greater than the potential provided to the first potential signal terminal VGL. It can be understood that the signal waveforms in the timing chart of the present disclosure are ideal waveforms, but the actually used waveforms (such as having a rising edge or a falling edge) also fall within the protection scope of the present disclosure. The output signal of the present disclosure having an intermediate potential value should not be understood as a potential value at any point of the falling edge or the rising edge, but has a relatively obvious low-potential output stage. The duration of this intermediate value potential output stage is greater than the duration of the rising and falling edges of the OUT terminal signal. In consideration of the output characteristics of the transistor, the intermediate value potential can be the end value of the slow-down phase.

Figure 10:
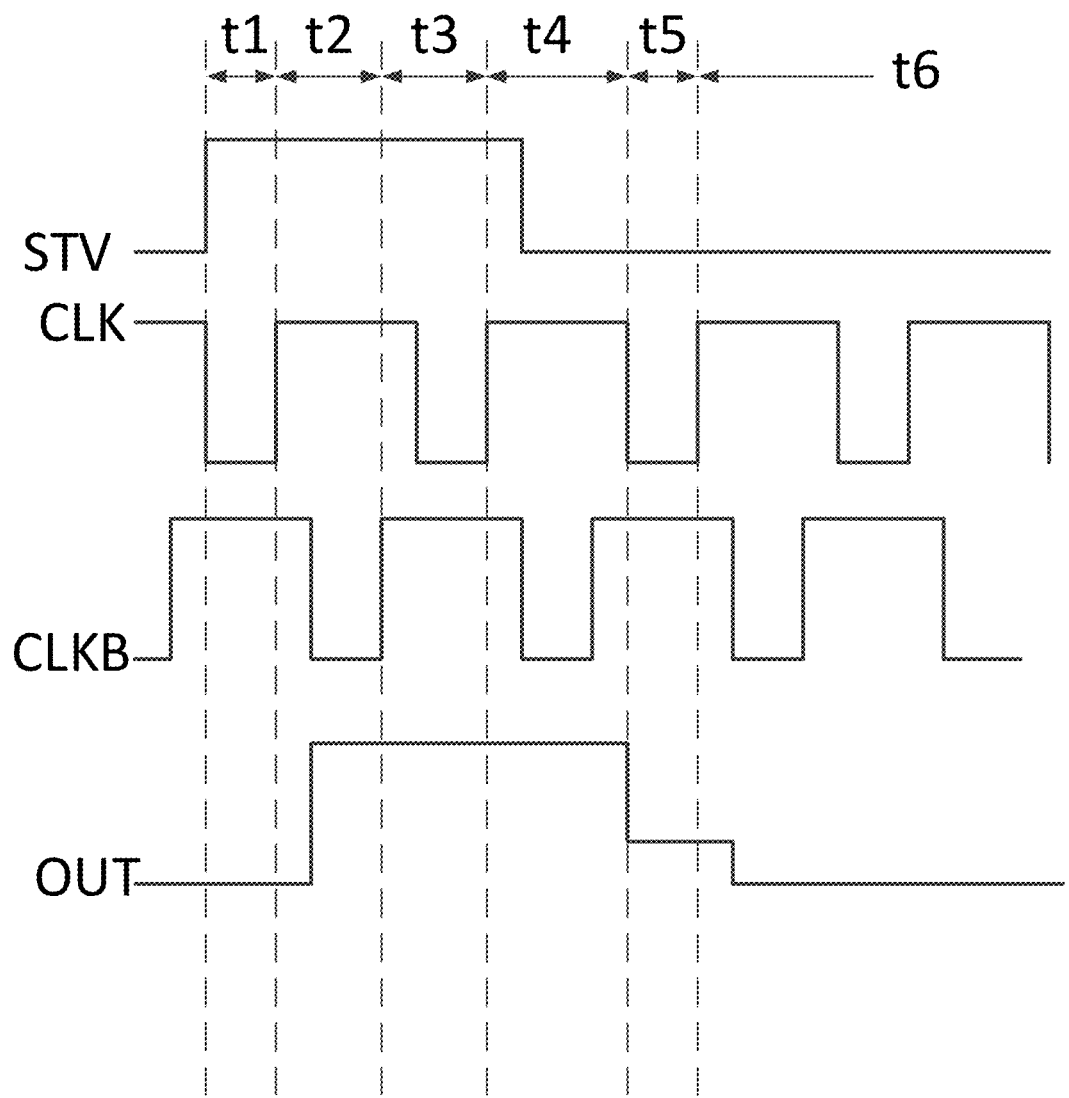
FIG. 10 is a timing chart according to an embodiment of the present disclosure.

The above is described using the shift register shown in FIG. 5A as an example, wherein the shift register shown in FIGS. 5B to 5E and FIGS. 6 to 9 is also applicable to the timing process in FIG. 10. The driving process is the same as the above embodiments, and is not repeated herein.

FIGS. 5A to 5E and FIGS. 6 to 9 are described by taking the transistors as P-type transistors as an example. Under the same principle, it is also within the protection scope of the present disclosure that each transistor is an N-type transistor.

Figure 11:
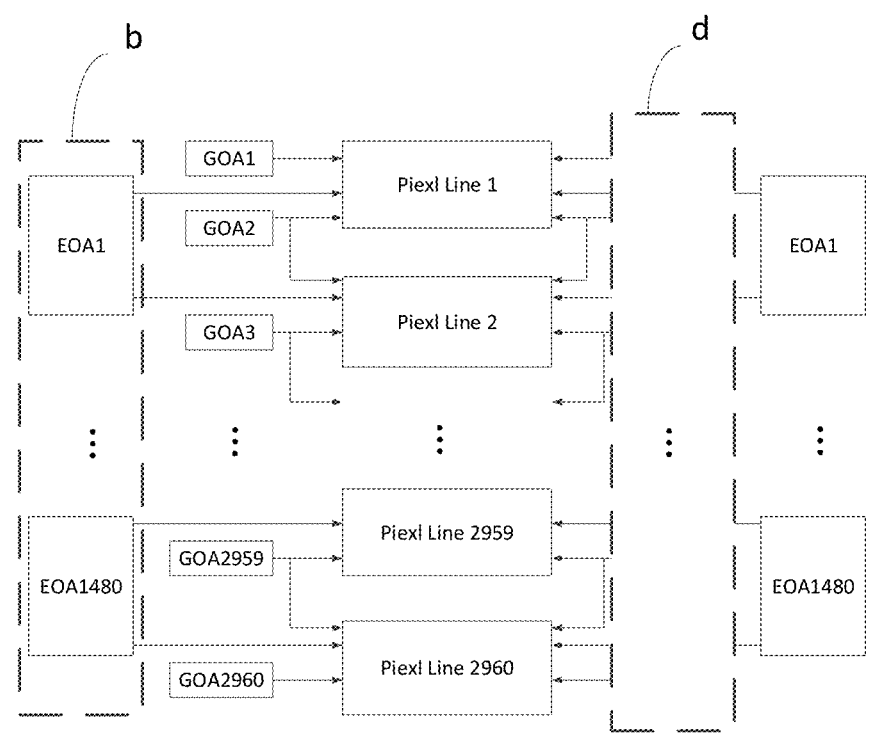
FIG. 11 is a schematic diagram illustrating the layout of a driving circuit in a display panel according to an embodiment of the present disclosure.

In some embodiments, as shown in FIG. 11, a light-emitting driving circuit b and a gate driving circuit d located in the non-display area of the display panel are included.

In some embodiments, as shown in FIG. 11, the light-emitting driving circuit b is located on one side of the gate driving circuit d far away from an edge of the display area.

A signal of the signal output terminal of one stage of the shift register may be provided to a plurality of pixel circuit groups in the display area. Thus, the number of shift registers in the light-emitting driving circuit is reduced, which is beneficial to the wiring of the panel.

It should be noted that FIG. 11 illustrates an example in which the display area includes 2960 pixel circuit groups (Pixel Line 1~Pixel Line 2960), the light-emitting driving circuit b includes EOA1~EOA1480, and the gate driving circuit d includes GOA1~GOA2960. Except a last stage of GOA, a signal output terminal of each stage of remaining GOAs is electrically connected to an input signal terminal of a next stage of GOA adjacent thereto; each stage of GOA is configured to drive a pixel circuit group, and each stage of EOA is configured to drive two pixel circuit groups to reduce the number of EOAs in the light-emitting driving circuit. FIG. 11 is only an exemplary embodiment, and the present disclosure is not limited thereto. The number of pixel circuit groups driven by EOAs can be selected according to actual use.

The display device can be any product or component with a display function, such as a mobile phone, a tablet personal computer, a television, a display, a notebook computer, a digital photo frame, a navigator and the like. For the implementation of the display device, reference may be made to the above embodiments of the light-emitting driving circuit, and repeated descriptions are omitted.

An embodiment of the present disclosure provides a display device, including a plurality of pixel circuits located in a display area, and a light-emitting driving circuit located in a non-display area and electrically connected to the pixel circuits; the light-emitting driving circuit includes a plurality of cascaded shift registers; except a last stage of shift register, a signal output terminal of each stage of remaining shift registers is electrically connected to an input signal terminal of a next stage of shift register adjacent thereto; wherein each of the plurality of cascaded shift registers includes: an input circuit, a first node potential control circuit, a second node potential control circuit, a first isolation circuit, a second isolation circuit, a first output control circuit, a second output control circuit, a capacitor circuit, a first output circuit and a second output circuit; through mutual cooperation of the circuits, the potentials of the control terminal of the first output control circuit and the control terminal of the second output circuit are kept stable without interference from other signals, thereby ensuring the stability of the output signal.

Obviously, those skilled in the art can make various modifications and variations to the present disclosure without departing from the spirit and scope of the present disclosure. In this way, if these modifications and variations of the present disclosure fall within the scope of the claims of the present disclosure and their equivalent art, the present disclosure also intends to include these modifications and variations.

The invention claimed is:
1. A display device, comprising:
a plurality of pixel circuits located in a display area, wherein the plurality of pixel circuits comprises N rows of pixel circuit groups, and each row of pixel circuit group comprises M pixel circuits, and wherein N and M are positive integers; and
a light-emitting driving circuit located in a non-display area, wherein the light-emitting driving circuit comprises a plurality of cascaded shift registers; a signal output terminal of each stage of the plurality of cascaded shift registers except a last stage is electrically connected to an input signal terminal of a next stage of shift register adjacent thereto, and each stage of shift register is connected to at least one of the N rows of pixel circuit groups through a light-emitting control line;
wherein each of the plurality of cascaded shift registers comprises: an input circuit, a first node potential control circuit, a second node potential control circuit, a first isolation circuit, a second isolation circuit, a first output control circuit, a second output control circuit, a capacitor circuit, a first output circuit and a second output circuit;
wherein:
the input circuit is configured to provide a signal of an input signal terminal to an input terminal of the second isolation circuit under control of signal of a first clock signal terminal;
the first node potential control circuit is configured to provide a first potential signal of a first potential signal terminal to an input terminal of the first isolation circuit under control of a signal of the first clock signal terminal, and provide a first clock signal of the first clock signal terminal to the input terminal of the first isolation circuit under control of a signal of the input terminal of the second isolation circuit;
the second node potential control circuit is configured to provide a second potential signal of a second potential signal terminal to the input terminal or an output terminal of the second isolation circuit under control of a signal of the input terminal or an output terminal of the first isolation circuit;

the first isolation circuit is configured to isolate an electrical potential of the input terminal of the first isolation circuit from an electrical potential of the output terminal of the first isolation circuit under control of the first potential signal;

the second isolation circuit is configured to isolate an electrical potential of the input terminal of the second isolation circuit from an electrical potential of a control terminal of the second output circuit under control of the first potential signal;

the first output control circuit is configured to provide the second clock signal to a control terminal of the first output circuit under control of the signal of the output terminal of the first isolation circuit and the second clock signal;

the second output control circuit is configured to control an electrical potential of the control terminal of the second output circuit under control of the second clock signal;

the first output circuit is configured to provide the second potential signal to the signal output terminal under control of an electrical potential of the control terminal of the first output circuit; and the second output circuit is configured to provide the first potential signal to the signal output terminal under control of the electrical potential of the control terminal of the second output circuit;

wherein the signal output terminal is electrically connected to the light-emitting control line.

2. The display device according to claim 1, wherein the display area further comprises: a plurality of gate lines extending in a row direction, and a plurality of data lines extending in a column direction;

for a pixel circuit at position (n, m), wherein $1 \leq n \leq N$, $1 \leq m \leq M$, the pixel circuit comprises: a first light-emitting element, a driving transistor, a data writing transistor, a compensation transistor, a first light-emitting control transistor, a second light-emitting control transistor, a first reset transistor, a second reset transistor, and a storage capacitor;

wherein:
a first electrode of the driving transistor is electrically connected to a power supply line through the first light-emitting control transistor, and a second electrode of the driving transistor is electrically connected to an anode of the first light-emitting element through the second light-emitting control transistor;

a control electrode of the first light-emitting control transistor and a control electrode of the second light-emitting control transistor each is electrically connected to a corresponding light-emitting control line;

a control electrode of the data writing transistor is electrically connected to an nth row of gate line, a first electrode of the data writing transistor is electrically connected to an mth column of data line, and a second electrode of the data writing transistor is electrically connected to the first electrode of the driving transistor;

a control electrode of the compensation transistor is electrically connected to a nth row of gate line, and a first electrode of the compensation transistor is electrically connected to a control electrode of the driving transistor, and a second electrode of the compensation transistor is electrically connected to the second electrode of the driving transistor;

a first terminal of the storage capacitor is electrically connected to the power supply line, and a second terminal of the storage capacitor is electrically connected to the control electrode of the driving transistor;

a control electrode of the first reset transistor is electrically connected to an nth row of reset line, a first electrode of the first reset transistor is electrically connected to the control electrode of the driving transistor, and a second electrode of the first reset transistor is electrically connected to an initial potential line;

a control electrode of the second reset transistor is electrically connected to a (n+1)th row of reset line, a first electrode of the second reset transistor is electrically connected to the anode of the first light-emitting element, and a second electrode of the second reset transistor is electrically connected to the initial potential line; and a cathode of the first light-emitting element is electrically connected to a low-potential line.

3. The display device according to claim 2, wherein the non-display area further comprises: a gate driving circuit connected to the plurality of gate lines extending in the row direction;

the light-emitting driving circuit is located at a side of the gate driving circuit far away from an edge of the display area.

4. The display device according to claim 1, wherein:
the input circuit comprises: a first transistor;
wherein a gate of the first transistor is electrically connected to the first clock signal terminal, and a first electrode of the first transistor is electrically connected to the input signal terminal, and a second electrode of the first transistor is electrically connected to the input terminal of the first isolation circuit;

the first node potential control circuit comprises: a second transistor and a third transistor;

wherein a gate of the second transistor is electrically connected to an output terminal of the input circuit, a first electrode of the second transistor is electrically connected to the first clock signal terminal, and a second electrode of the second transistor is electrically connected to the input terminal of the first isolation circuit; a gate of the third transistor is electrically connected to the first clock signal terminal, a first electrode of the third transistor is electrically connected to the first potential signal terminal, and a second electrode of the third transistor is electrically connected to the input terminal of the first isolation circuit; and the second output control circuit comprises: a first capacitor;

wherein a first electrode of the first capacitor is electrically connected to the second clock signal terminal, and a second electrode of the first capacitor is electrically connected to the control terminal of the second output circuit.

5. The display device according to claim 1, wherein the second node potential control circuit comprises: a fourth transistor and a fifth transistor;

wherein:
a gate of the fourth transistor is electrically connected to a second electrode of the fifth transistor, a first electrode of the fourth transistor is electrically connected to the second potential signal terminal, and a second electrode of the fourth transistor is electrically connected to the input terminal or the output terminal of the second isolation circuit; and a gate of the fifth transistor is electrically connected to the input terminal or the output terminal of the first isolation circuit, and a first electrode of the fifth transistor is electrically connected to the second clock signal terminal.

6. The display device according to claim 1, wherein the second node potential control circuit comprises: a fourth transistor and a fifth transistor;
wherein:
a gate of the fourth transistor is electrically connected to the second clock signal terminal, a first electrode of the fourth transistor is electrically connected to a second electrode of the fifth transistor, and a second electrode of the fourth transistor is electrically connected to the input terminal or the output terminal of the second isolation circuit; and
a gate of the fifth transistor is electrically connected to the input terminal or the output terminal of the first isolation circuit, and a first electrode of the fifth transistor is electrically connected to the second potential signal terminal.

7. The display device according to claim 1, wherein the first output control circuit comprises: a sixth transistor, a seventh transistor and an eighth transistor;
wherein:
a gate of the sixth transistor is electrically connected to the output terminal of the first isolation circuit, a first electrode of the sixth transistor is electrically connected to the second clock signal terminal, and a second electrode of the sixth transistor is electrically connected to a first electrode of the seventh transistor;
a gate of the seventh transistor is electrically connected to the second clock signal terminal, and a second electrode of the seventh transistor is electrically connected to the control terminal of the first output circuit; and
a gate of the eighth transistor is electrically connected to the control terminal of the second output circuit or the input terminal of the second isolation circuit, a first electrode of the eighth transistor is electrically connected to the second potential signal terminal, and a second electrode of the eighth transistor is electrically connected to the control terminal of the first output circuit.

8. The display device according to claim 7, wherein the capacitor circuit is configured to control the electrical potential of the output terminal of the first isolation circuit under control of the first output control circuit.

9. The display device according to claim 8, wherein the capacitor circuit comprises: a second capacitor;
wherein a first electrode of the second capacitor is electrically connected to the output terminal of the first isolation circuit, and a second electrode of the second capacitor is electrically connected to the first electrode of the seventh transistor.

10. The display device according to claim 1, wherein the first output control circuit comprises: a sixth transistor, a seventh transistor and an eighth transistor;
wherein
a gate of the sixth transistor is electrically connected to the output terminal of the first isolation circuit, a first electrode of the sixth transistor is electrically connected to the first potential signal terminal, and a second electrode of the sixth transistor is electrically connected to a first electrode of the seventh transistor;
a gate of the seventh transistor is electrically connected to the second clock signal terminal, and a second electrode of the seventh transistor is electrically connected to the control terminal of the first output circuit; and
a gate of the eighth transistor is electrically connected to the control terminal of the second output circuit or the input terminal of the second isolation circuit, a first electrode of the eighth transistor is electrically connected to the second potential signal terminal, and a second electrode of the eighth transistor is electrically connected to the control terminal of the first output circuit.

11. The display device according to claim 10, wherein the capacitor circuit is configured to control the electrical potential of the output terminal of the first isolation circuit under control of the signal of the second clock signal terminal.

12. The display device according to claim 11, wherein the capacitor circuit comprises: a second capacitor;
wherein a first electrode of the second capacitor is electrically connected to the output terminal of the first isolation circuit, and a second electrode of the second capacitor is electrically connected to the second clock signal terminal.

13. The display device according to claim 1, wherein:
the first output circuit comprises: a ninth transistor and a third capacitor;
wherein a gate of the ninth transistor is electrically connected to an output terminal of the first output control circuit, a first electrode of the ninth transistor is electrically connected to the second potential signal terminal, and a second electrode of the ninth transistor is electrically connected to the signal output terminal; and
a first electrode of the third capacitor is electrically connected to the gate of the ninth transistor, and a second electrode of the third capacitor is electrically connected to the second potential signal terminal; and
the second output circuit comprises: a tenth transistor;
wherein a gate of the tenth transistor is electrically connected to the output terminal of the second isolation circuit, a first electrode of the tenth transistor is electrically connected to the first potential signal terminal, and a second electrode of the tenth transistor is electrically connected to the signal output terminal.

14. The display device according to claim 1, wherein the first isolation circuit comprises: an eleventh transistor;
wherein a gate of the eleventh transistor is electrically connected to the first potential signal terminal, a first electrode of the eleventh transistor is electrically connected to the output terminal of the first node potential control circuit, and a second electrode of the eleventh transistor is electrically connected to the control terminal of the first output control circuit.

15. The display device according to claim 14, wherein the eleventh transistor is a dual-gate transistor.

16. The display device according to claim 14, wherein the eleventh transistor is an oxide semiconductor transistor.

17. The display device according to claim 1, wherein the second isolation circuit comprises: a twelfth transistor;

wherein a gate of the twelfth transistor is electrically connected to the first potential signal terminal, a first electrode of the twelfth transistor is electrically connected to the output terminal of the input circuit, and a second electrode of the twelfth transistor is electrically connected to the control terminal of the second output circuit.

18. The display device according to claim 17, wherein the twelfth transistor is a dual-gate transistor.

19. The display device according to claim 17, wherein the twelfth transistor is an oxide semiconductor transistor.

20. The display device according to claim 1, wherein a signal of the signal output terminal of one stage of shift register is provided to at least two of the N rows of the pixel circuits in the display area.

* * * * *